(12) United States Patent
Otsubo

(10) Patent No.: US 6,711,728 B1
(45) Date of Patent: Mar. 23, 2004

(54) FUNCTION SYNTHESIZING METHOD AND APPARATUS, AND RECORDING MEDIUM ON WHICH PROGRAM OF SAID METHOD IS RECORDED

(75) Inventor: Motohide Otsubo, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 09/506,365

(22) Filed: Feb. 18, 2000

(30) Foreign Application Priority Data

Feb. 23, 1999 (JP) .......................................... 11-045447

(51) Int. Cl.[7] .............................................. G06F 17/50
(52) U.S. Cl. .............................................. 716/18; 716/4
(58) Field of Search .................................. 716/18, 1, 4

(56) References Cited

U.S. PATENT DOCUMENTS 5,539,680 A * 7/1996 Palnitkar et al. ............... 703/13
6,044,211 A * 3/2000 Jain ............................... 716/18
6,182,268 B1 * 1/2001 McElvain ....................... 716/1
6,334,200 B1 * 12/2001 Fujiwara et al. ............. 714/738

* cited by examiner

*Primary Examiner*—Stacy A Whitmore
(74) *Attorney, Agent, or Firm*—Foley & Lardner

(57) ABSTRACT

Generating a logic circuit indicating an operation result which is easily comparable with an execution result of a program. In step S1, a data flow graph is generated based on only operation sentences of a C program. In step S2, the data flow graph is divided into parts and state names are assigned to the respective parts. In step S3, operations that output a value of an observation variable are detected from the data flow graph. The names of states where the detected operations are performed and the associated observation variables are stored in an observation variable-state list. An FSM is generated in step S4. In step S5, in the FSM, output terminals of an RT level description are added to control signal lines corresponding to the respective states in the list. Data paths are generated in step S6. In step S7, in the data paths, output terminals of an RT level description are added to signal lines corresponding to the respective observation variables in the list. In step S8, RT level data is generated by combining the FSM with the data paths.

11 Claims, 25 Drawing Sheets

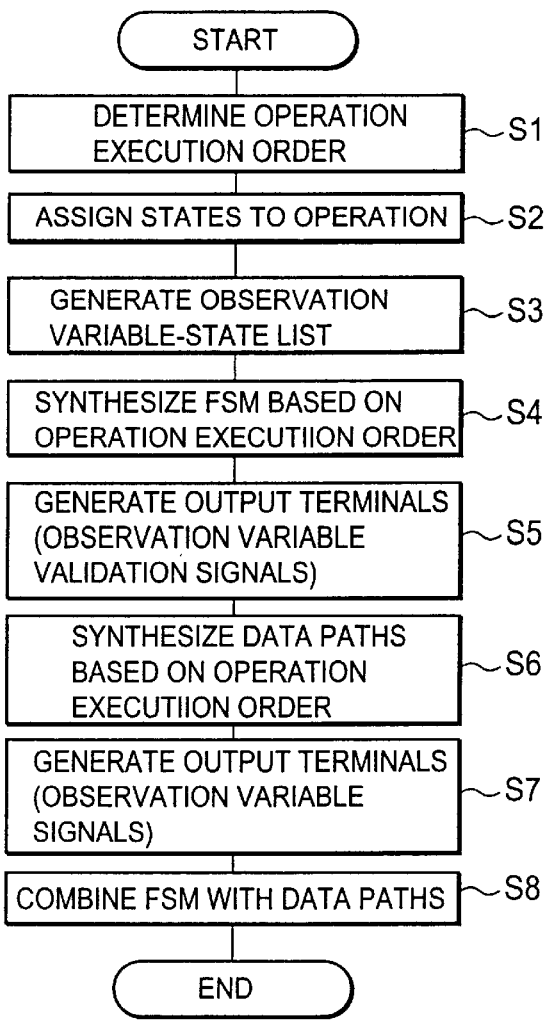

| OBSERVATION VARIABLE | STATE |
|---|---|
| x | ST02 |
| y | ST03 |

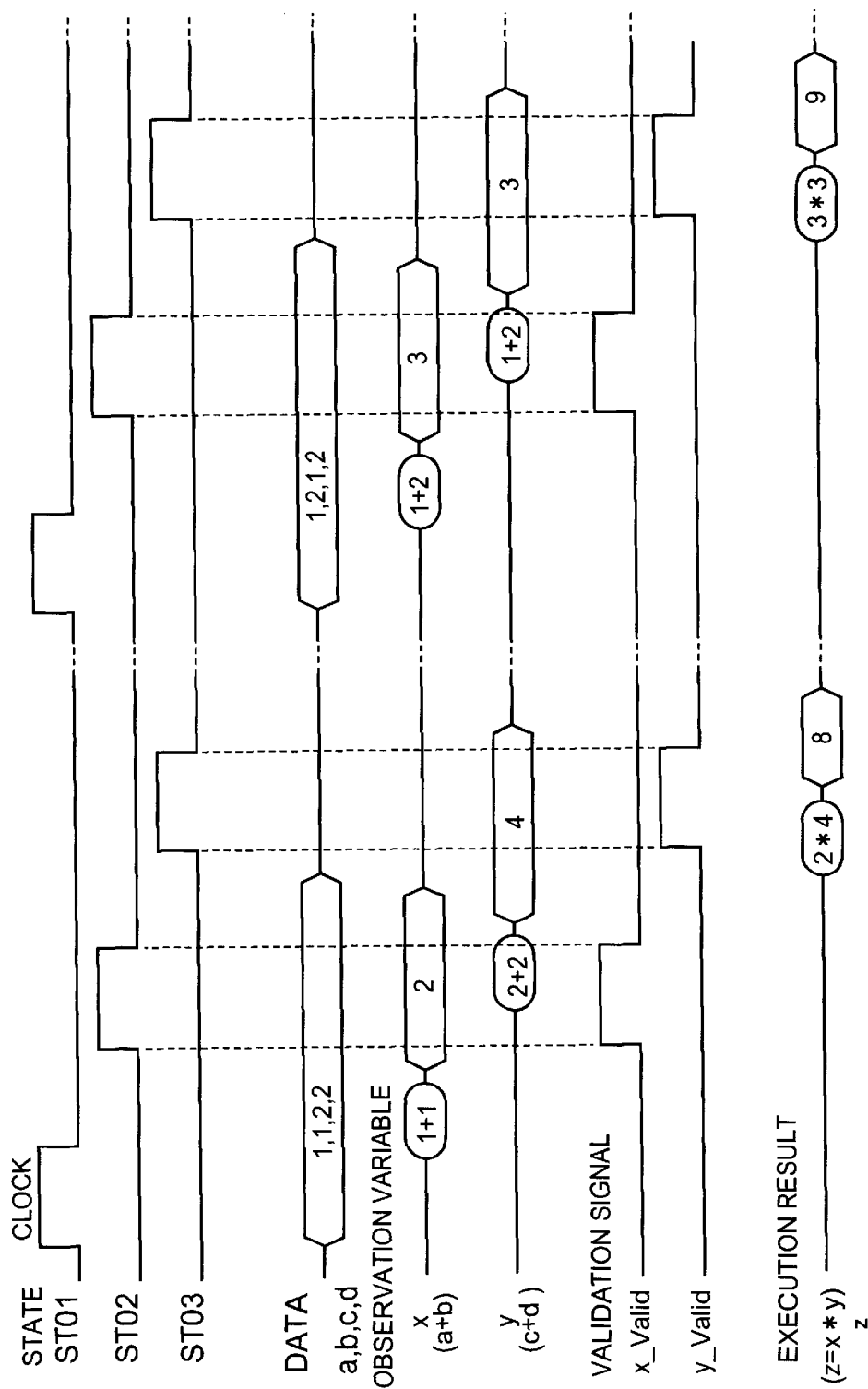

Fig.14(a)
Prior Art

TEST BENCH PROGRAM

```
main(){
   int z;
   calc(1,1,2,2,z);
   printf("result=%d\n", z) ;
   calc(1,2,1,2,z);
   printf("result=%d\n", z) ;
}
```

Fig.14(b)
Prior Art

PROGRAM EXECUTION RESULT

```
x=2
y=4
RESULT=8
x=3
y=3
RESULT=9
```

| CLOCK | 0 | 1 | 0 | 1 | 0 | 1 | 0 | 1 | 0 | 1 | 0 | 1 | 0 |
|---|---|---|---|---|---|---|---|---|---|---|---|---|---|
| a | - | 1 | 1 | 1 | 1 | 1 | 1 | 1 | 1 | 1 | 1 | 1 | 1 |
| b | - | 1 | 1 | 1 | 1 | 1 | 1 | 2 | 2 | 2 | 2 | 2 | 2 |
| c | - | 2 | 2 | 2 | 2 | 2 | 2 | 1 | 1 | 1 | 1 | 1 | 1 |
| d | - | 2 | 2 | 2 | 2 | 2 | 2 | 2 | 2 | 2 | 2 | 2 | 2 |
| x | - | - | - | 2 | 2 | 2 | 2 | 2 | 2 | 3 | 3 | 3 | 3 |
| y | - | - | - | - | - | 4 | 4 | 4 | 4 | 4 | 4 | 3 | 3 |
| z | - | - | - | - | - | 8 | 8 | 8 | 8 | 8 | 8 | 9 | 9 |
| ST01 | 0 | 1 | 1 | 0 | 0 | 0 | 0 | 1 | 1 | 0 | 0 | 0 | 0 |
| ST02 | 0 | 0 | 0 | 1 | 1 | 0 | 0 | 0 | 0 | 1 | 1 | 0 | 0 |
| ST03 | 0 | 0 | 0 | 0 | 0 | 1 | 1 | 0 | 0 | 0 | 0 | 1 | 1 |

FUNCTION SYNTHESIZING METHOD AND APPARATUS, AND RECORDING MEDIUM ON WHICH PROGRAM OF SAID METHOD IS RECORDED

BACKGROUND OF THE INVENTION

1. Field of the Invention

The present invention relates to a function synthesizing method for converting a program that is written in a general-purpose programming language (e.g., the C language) into a logic circuit that performs an operation defined by the program, and to a function synthesizing apparatus that executes the above function synthesizing method. The invention also relates to a recording medium on which a program of the above function synthesizing method is recorded.

2. Description of Conventional Technology

In electronic circuit designing, converting a program that is written in a general-purpose programming language (e.g., the C language) into a logic circuit that performs an operation defined by the program (hereinafter referred to as "function synthesis") is commonly done.

Data indicating a post-conversion logic circuit is RT (register transfer) level data or gate level data. The RT level data is data written in a hardware description language and defining a logic circuit. The gate level data is data as a combination of transistor gates.

FIG. 21 is a block diagram showing an example configuration of an electronic circuit data (mask data) generation system to which a conventional function synthesizing method is applied.

Specifically, the electronic circuit data generation system shown in FIG. 21 is a computer apparatus consisting of a CPU (Central Processing Unit) and peripheral circuits and devices. This computer apparatus performs the following operation based on a control program that is recorded in a built-in semiconductor memory (ROM, RAM, or the like) or an external storage device (hard disk, magneto-optical disc, or the like).

In FIG. 21, a C program storage section 1 stores a C program that defines an (or a part of) operation of a desired electronic circuit.

A function synthesizing section 102 converts the C program stored in the C program storage section 1 into RT level data (i.e., performs function synthesis).

An optimizing section 3 optimizes the RT level data generated by the function synthesizing section 102. This optimization is attained by commonizing operation elements (described later).

An RT level data storage section 4 stores the RT level data that has been optimized by the optimizing section 3.

A logic synthesizing section 5 generates gate level data from the RT level data stored in the RT level data storage section 4. A Gate level data storage section 6 stores the Gate level data generated by the logic synthesizing section 5.

A layout section 7 converts the Gate level data stored in the Gate level data storage section 6 into mask data (that is necessary to generate a combination of transistor gates that is indicated by the Gate level data).

A mask data storage section 8 stores the master data generated by the layout section 7.

After the master data is generated by the above processing, a prescribed manufacturing process (not shown) manufactures a desired electronic circuit by using the master data.

Next, the configuration and operation of the function synthesizing section (i.e., the function synthesizing section 102 in FIG. 21) that executes the conventional function synthesizing method will be described.

FIG. 22 is a block diagram showing a configuration example of the function synthesizing section 102.

FIG. 23 is a flowchart showing an operation example of the function synthesizing section 102.

As shown in FIG. 22, the function synthesizing section 102 is configured by a scheduling section 1021, an FSM generation section 1022, a data path generation section 1023, a combining section 1024, and a scheduling result storage section 1025.

With this configuration, when an operator gives the function synthesizing section 102 a function synthesis execution command by using a prescribed operation panel (not shown), the process of the function synthesizing section 102 goes to step S101 in FIG. 23.

In step S101, the scheduling section 1021 reads out a C program from the C program storage section 1.

As an example (hereinafter referred to as "conventional example"), assume here that a C program shown in FIG. 4 is read out.

Then, the scheduling section 1021 disregards output sentences in the read-out C program and regenerates a data flow graph based on only operation sentences.

The term "output sentence" means a program sentence, such as a print sentence, that is intended for data printing (rather than operation).

In the conventional example, the scheduling section 1021 generates a data flow graph shown in FIG. 5 based on the C program shown in FIG. 4.

Then, the process of the function synthesizing section 102 goes to step S102 in FIG. 23.

In step S102, the scheduling section 1021 divides, by using a prescribed operation clock signal, the data flow graph into operations that are performed at respective clocks of the operation clock signal.

In the conventional example, the scheduling section 1021 divides the data flow graph of FIG. 5 in a manner shown in FIG. 6.

The divisional pattern (i.e., the number of operations to be performed at respective clocks) depends on various parameters (relating to electronic circuit designing) that are preset by an operator.

That is, if the parameters are so set as to generate a high-speed electronic circuit, the data flow graph is divided so that as many operations as possible are performed per clock.

On the other hand, if the parameters are so set as to reduce the electronic circuit scale, the data flow graph is divided so that each gate can be reused by as many operations as possible (i.e., operations of the same kind are performed at as many different clocks as possible).

Then, the scheduling section 1021 assigns state names (identification names unique to respective clocks) to respective clocks.

In the conventional example, state names ST01, ST02, and ST03 are assigned as shown in FIG. 6.

In the following, a data flow graph after assigning of state names will be referred to as "state-assigned data flow graph."

The scheduling section 1021 stores a state-assigned data flow graph in the scheduling result storage section 1025.

Then, the process of the function synthesizing section 102 goes to step S104 in FIG. 23.

In step S104, the FSM generation section 1022 generates an FSM (finite state machine) based on the scheduling result (i.e., the state-assigned data flow graph) stored in the scheduling result storage section 1025.

In the conventional example, the FSM generation section 1022 generates an FSM shown in FIG. 8 based on the data flow graph shown in FIG. 6.

As shown in FIG. 8, lines extended from the respective states (ST01, ST02, ST03) of the FSM are referred to here as "control signal lines."

Then, the process of the function synthesizing section 102 goes to step S106 in FIG. 23.

In step S106, the data path generation section 1023 generates data paths based on the scheduling result (i.e., the state-assigned data flow graph) that is stored in the scheduling result storage section 1025.

Further, the data path generation section 1023 detects variables that should hold a value over a plurality of states based on the state-assigned data flow graph, and adds flip-flops to signal lines (in the data paths) corresponding to the detected variables.

A trigger signal (control signal) to be applied to each flip-flop is made a signal corresponding to a state that is one-step before a state where the operation is executed by using a value of the variable corresponding to the flip-flop.

In the conventional example, the data path generation section 1023 generates data paths shown in FIG. 10 based on the data flow graph shown in FIG. 6.

Since values of variables a and b are used in addition in state ST02 as shown in FIG. 6, in FIG. 10 a control signal corresponding to state ST01 is given to the flip-flops corresponding to variables a and b.

Since values of variables c and d are used in addition in state ST03, a control signal corresponding to state ST02 is given to the flip-flops corresponding to variables c and Since a value of x is used in multiplication in state ST03, a control signal corresponding to state ST02 is given to the flip-flop corresponding to variable x.

Since it is not necessary to hold a value of y over a plurality of states, no flip-flop corresponding to variable y is added.

It appears that a value of z is merely output and is not used in any operation. However, since variable z is connected to another circuit at an output destination (and hence used in operation), variable z is used in an external circuit in state ST01 (attention should be paid to the fact that state ST01 follows state ST03 as shown in FIG. 8). Therefore, a control signal corresponding to state ST03 is given to the flip-flop corresponding to variable z.

Then, the process of the function synthesizing section 102 goes to step S107 in FIG. 23.

In step S107, the data path generation section 1023 detects, from the C program, variables (hereinafter referred to as "observation variables") that are print-designated in output sentences of the C program.

In the conventional example, the C program includes the following output sentences:

printf("x=%d\n", x);

and printf("y=%d\n", y);

Therefore, the data path generation section 1203 detects x and y as observation variables.

Then, the data path generation section 1023 detects signal lines corresponding to those observation variables from the data paths, and adds output terminals (of an RT level description) to the detected signal lines.

In the conventional example, since the observation variables are x and y, the data path generation section 1023 adds output terminals (of an RT level description) to the signal lines corresponding to observation variables x and y as shown in FIG. 11.

Then, the process of the function synthesizing section 102 goes to step S108 in FIG. 23.

In step S108, the combining section 1024 combines the FSM (generated by the FSM generation section 1022) with the data paths (generated by the data path generation section 1023) and thereby generates RT level data.

Specifically, the combining section 1024 connects the control signal line (in the FSM) corresponding to each state to the clock terminal(s) of the flip-flop(s) (in the data paths) corresponding to the state.

In the conventional example, the combining section 1024 combines the FSM shown in FIG. 8 with the data paths shown in FIG. 11 and thereby generates RT level data shown in FIG. 24.

The description of the configuration and operation of the function synthesizing section 102 has completed.

Next, the optimization (of RT level data) that is performed by the optimizing section 3 will be described.

The term "optimization" as used herein means realizing a function that is equivalent to a subject logic circuit as a circuit having a smaller circuit scale (e.g., having smaller a number of operation elements or registers).

FIG. 25 is a flowchart showing an optimization process example that is executed by the optimizing section 3. The following description is directed to an example case of optimizing RT level data shown in FIG. 15. The RT level data shown in FIG. 15 is of a synthesized function of x=a+b+c.

In step Sill, two operation elements are selected as candidates for commonization.

In the example of FIG. 15, adders op1 and op2 are selected.

In step S112, the control signals of the flip-flops (hereinafter referred to as "input-side FFs") that are connected to the inputs of the two selected operation elements are checked. If On-periods of the two control signals overlap with each other, the process returns to step S111, where other operation elements are selected. On the other hand, if On-periods of the two control signals do not overlap with each other, the process goes to step S113.

In the example of FIG. 15, control signals ST01 and ST02 are not in an On-state simultaneously and hence the process goes to step S113.

In step S113, the two operation elements are separated from the data path portion together with the input-side FFs. In the data path portion, labels (signal names) are attached to the locations of separation.

In the example of FIG. 15, as shown in FIG. 26, the adders op1 and op2 are separated from the data path portion together with the input-side FFs. Further, as shown in FIG. 26, signal names a, b, c, x, w, ST01, and ST02 are attached to the locations of separation in the data path portion.

Steps S114–S118 are steps for commonizing the two separated operation elements (see FIG. 26) into a single operation element (see FIG. 27).

In step S114, the two separated operation elements are commonized into one of those operation elements. The output names of both operation elements before the commonization are attached, as labels, to the output the common operation element.

In step S115, the input-side FFs of the two separated operation elements are commonized into the input-side FFs of the operation element into which the commonization was made in step S114.

In step S116, the control signals of the input-side FFs of the two separated operation elements are ORed. A resulting control signal is made a control signal of the input-side FFs (hereinafter referred to as "common input-side FFs") into which the commonization was made in step S115.

In step S117, switching circuits for switching between input signals of the input-side FFs of one operation element and input signals of the input-side FFs of the other operation element are generated by using multiplexers. Output signals of the multiplexer are employed as input signals of the common input-side FFs.

In step S118, the control signal of the input-side FFs of one of the two operation elements is employed as a select input of the multiplexers. This is done so that when a select signal is input, input signals of the input-side FFs of the operation element corresponding to the control signal that is input as the select signal are selected by the multiplexers.

In the example of FIG. 15, the two operation elements shown in FIG. 26 are commonized into the single operation element shown in FIG. 27 by execution of steps S114–S118.

In step S119, the labels in the data path portion are connected to the labels of the circuit that was generated by steps S114–S118, whereby the commonized circuit is returned to the data path portion.

In the example of FIG. 15, the (common) operation element shown in FIG. 27 is returned to the data path portion shown in FIG. 26, whereby the optimization produces RT level data shown in FIG. 16. In this example, the flip-flops Ra and Rw in FIG. 15 have been commonized into a flip-flop Ra/w in FIG. 16. The flip-flops Rb and Rc in FIG. 15 have been commonized into a flip-flop Rb/c in FIG. 16. The adders op1 and op2 in FIG. 15 have been commonized into an adder op1/2 in FIG. 16.

The optimization has thus completed.

Incidentally, in the above electronic circuit data generation system, in general, each data (RT level data or Gate level data) that is generated at an intermediate stage is subjected to an operation check.

A program execution section 9, an RT level simulator 10, a Gate level simulator 11, a test bench program storage section 13, a program execution result storage section 14, an RT level simulation result storage section 15, and a Gate level simulation result storage section 16 shown in FIG. 21 are sections for such an operation check.

Specifically, these sections are a computer apparatus consisting of a CPU and peripheral circuits and devices. This computer apparatus performs the following operation based on a control program that is recorded in a built-in semiconductor memory (ROM, RAM, or the like) or an external storage device (hard disk, magneto-optical disc, or the like).

In FIG. 21, the test bench program storage section 13 stores a test bench program.

The test bench program means a program that gives prescribed test data to a C program, RT level data, or Gate level data.

The test bench program storage section 13 stores test bench programs for giving the same test data to a C program, RT level data, and Gate level data.

The program execution section 9 executes the C program stored in the C program storage section 1 by using the test bench program (for a C program) stored in the test bench program storage section 13.

The program execution result storage section 14 stores an execution result of the C program.

FIGS. 14(a) and 14(b) show an example of a test bench program for a C program and an example of its execution result, respectively. The execution result shown in FIG. 14(b) is one obtained when the C program shown in FIG. 4 is executed by using the test bench program shown in FIG. 14(a).

The RT level simulator 10 simulates an operation of a logic circuit that is defined by RT level data stored in the RT level data storage section 4 by using the test bench program (for RT level data) stored in the test bench program storage section 13.

The RT level simulation result storage section 15 stores an operation result of the logic circuit defined by the RT level data.

FIG. 28 shows an example of an operation result of a logic circuit that is defined by RT level data generated by the conventional function synthesizing method.

The Gate level simulator 11 simulates an operation of an electronic circuit (a combination of transistor gates) that is defined by Gate level data stored in the Gate level data storage section 6 by using the test bench program (for Gate level data) stored in the test bench program storage section 13.

The Gate level simulation result storage section 16 stores an operation result of the electronic circuit that is defined by the Gate level data.

An operator judges that the function synthesis by the function synthesizing section 102 has been performed normally when he confirms that a reasonable result is obtained by inferring from the test programs given to the section 102 while looking at the execution result (of the C program) stored in the program execution result storage section 14, the simulation result (the operation result of the logic circuit defined by the RT level data) stored in the RT level simulation result storage section 15, and the gate level simulation result.

FIG. 29 is a timing diagram showing an example of an operation result of a logic circuit that is defined by RT level data generated by the conventional function synthesizing method. FIG. 29 is such that the operation result of FIG. 28 is shown in the form of a timing chart.

In FIG. 29, values given as data a, b, c, and d, that is, "1, 1, 2, 2" and "1, 2, 1, 2," are values (test data) that are read into the logic circuit via the input terminals a, b, c, and d shown in FIG. 24 (with the timing shown in FIG. 29). They have the same values as the test data (arguments of a function calc) that are given by the test bench program (for a C program) shown in FIG. 14(a).

The operator judges whether the function synthesis is normal or not by checking whether reasonable values that are expected from the input values are obtained. In FIG. 29, values read out as observation variable x, that is, "2" and "3," are values read out from the output terminal x shown in FIG. 24 (with the timing shown in FIG. 29) and have the same values as values of a C program execution result ("x=2" and "x=3") shown in FIG. 14(b). (Not only intermediate values x and y obtained halfway but also a final value z is called an execution result value.) In FIG. 29, values read out as observation variable y, that is, "4" and "3," are values read out from the output terminal y shown in FIG. 24 (with the timing shown in FIG. 29) and have the same values as values of a C program execution result ("y=4" and "x=3") shown in FIG. 14(b).

In FIG. 29, values read out as execution result z, that is, "8" and "9," are values read out from the output terminal z shown in FIG. 24 (with the timing shown in FIG. 29) and have the same values as values of a C program execution result ("result=8" and "result=9") shown in FIG. 14(b).

In the conventional case, an operator checks values of a C program execution result and output values of the output terminal z. That is, in the above example, the operator compares the execution result (of the C program) shown in FIG. 14(b) and the simulation result (of the RT level data) shown in FIG. 29, and he can confirm that the function synthesis by the function synthesizing section 102 has been performed normally because the two results are identical.

Incidentally, the above-described conventional function synthesizing method requires work of checking a C program execution result and simulation results of RT level data and Gate level data, respectively. Further, when it is intended to check only one of the above simulation results manually and check the other automatically through mechanical comparison, the following problem arises. That is, in checking an operation of a logic circuit that is defined by RT level data generated by a function synthesizing method, it is difficult to determine when to read out values to be compared with a C program execution result (during a simulation for the RT level data).

This results from the fact that it is difficult to correlate variable values of a C program with those of a simulation for RT level data. Whereas the lines of a program is executed sequentially on a line-by-line basis and variable values are first output (e.g., printed) when a line including an output sentence (e.g., a print sentence) is reached, in a simulation for RT level data variable values can be read out at any time point during processing (as long as corresponding signal lines are extended).

For example, referring to FIG. 29, if values of variables x and y are read out at time point $\epsilon$, they are equal to "x=2, y=4" shown in FIG. 14(b). If values of variables x and y are read out at time point $\angle$, they are equal to "x=3, y=3" shown in FIG. 14(b). However, if values of variables x and y are read out at time points, they are such that (x, y)=(3, 4) and they do not coincide with any execution result (see FIG. 14(b)) of the C program.

As a result, although the logic circuit defined by the RT level data operates normally, a judgment is made to the effect that the function synthesis by the function synthesizing section 102 is not being performed normally.

As described above, the conventional function synthesizing method has a problem that when an operator attempts to check whether function synthesis is being performed normally, a large number of steps and very long time are needed because he needs to check an enormous amount of data by himself and it is difficult to make a correct judgment because he cannot determine when to compare data. Even in the case of doing an automatic operation check on function synthesis, there is a problem that it is difficult to determine when to read out values to be compared with a C program execution result and hence it is difficult to compare the C program execution result with an operation result of a logic circuit (defined by RT level data).

Therefore, it is difficult to perform an operation check on function synthesis at an intermediate stage. If a logic circuit has been generated without checking its operation halfway and it does not operate as designed, it is necessary to restart function synthesis designing from the first stage. This means problems that the steps taken so far become useless and that a large delay occurs in the development schedule.

BRIEF SUMMARY OF THE INVENTION

Object of the Invention

The present invention has been made in the above circumstances, and an object of the invention is therefore to provide a function synthesizing method and apparatus which can generate a logic circuit that produces an operation result that can easily be compared with a program execution result, as well as a recording medium on which a program of the above function synthesizing method is recorded.

SUMMARY OF THE INVENTION

According to a first aspect of the invention as set forth in claim 1, there is provided a function synthesizing method for generating a logic circuit from a program, wherein the function synthesizing method generates a logic circuit that provides a time point when an execution result is determined.

According to the invention as set forth in claim 2, there is also provided a function synthesizing method for generating a logic circuit from a program, wherein the function synthesizing method generates a logic circuit that provides an observation variable that is designated by an output sentence in the program and a time point when an execution result is determined.

The term "execution result" means an intermediate value or a final value of an operation or both of them.

According to the invention as set forth in claim 3, there is also provided a function synthesizing method for generating a logic circuit from a program, comprising the steps of dividing the program; assigning state names to respective divisional ranges; detecting a state name of a state where an operation that outputs a value of an observation variable that is designated by an output sentence in the program is executed; generating, based on the program, an FSM that controls state transitions between states having the state names; extending, to an output, a signal line of a control signal indicating a time point of a transition to the state of the detected state name as a signal line that gives a time point when to read out a value of the observation variable; generating data paths based on the program; and generating a logic circuit by combining the FSM with the data paths.

According to the invention as set forth in claim 4, the function synthesizing method may further comprise an optimizing step of generating as set forth in claim 3, by modifying the generated logic circuit, a second logic circuit being equivalent in function to and smaller in the number of constituent elements (such as operation elements or registers) than the generated logic circuit.

The function synthesizing method may further comprise the steps of comparing an output result of an output sentence in the program with an output result obtained at a time point given by the generated logic circuit; and judging correctness of function synthesis based on the comparison result.

According to a second aspect of the invention, there is provided a function synthesizing apparatus for generating a logic circuit from a program, wherein the function synthesizing apparatus generates a logic circuit that provides a time point when an execution result is determined.

There is also provided a function synthesizing apparatus for generating a logic circuit from a program, wherein the function synthesizing apparatus generates a logic circuit that provides an observation variable that is designated by an output sentence in the program and a time point when an execution result is determined.

There is also provided a function synthesizing apparatus for generating a logic circuit from a program, comprising means for dividing the program; means for assigning state names to respective divisional ranges; means for detecting a state name of a state where an operation that outputs a value of an observation variable that is designated by an output sentence in the program is executed; means for generating, based on the program, an FSM that controls state transitions between states having the state names; means for extending, to an output, a signal line of a control signal indicating a time point of a transition to the state of the detected state name as a signal line that gives a time point when to read out a value of the observation variable; means for generating data paths based on the program; and means for generating a logic circuit by combining the FSM with the data paths.

The function synthesizing apparatus may further comprise means for generating, by modifying the generated logic circuit, a second logic circuit being equivalent in function to and smaller in circuit scale than the generated logic circuit.

The function synthesizing apparatus may further comprise means for comparing an output result of an output sentence in the program with an output result obtained at a time point given by the generated logic circuit; and judging correctness of function synthesis based on the comparison result.

According to a third aspect of the invention, there is provided a recording medium on which a program for causing a computer to execute a function synthesizing method for generating a logic circuit from a program is recorded, wherein the function synthesizing method generates a logic circuit that provides an observation variable that is designated by an output sentence in the program and a time point when an execution result is determined.

There is also provided a recording medium on which a program for causing a computer to execute a function synthesizing method for generating a logic circuit from a program is recorded, the function synthesizing method comprising the steps of dividing the program; assigning state names to respective divisional ranges; detecting a state name of a state where an operation that outputs a value of an observation variable that is designated by an output sentence in the program is executed; generating, based on the program, an FSM that controls state transitions between states having the state names; extending, to an output, a signal line of a control signal indicating a time point of a transition to the state of the detected state name as a signal line that gives a time point when to read out a value of the observation variable; generating data paths based on the program; and generating a logic circuit by combining the FSM with the data paths.

The recording medium may be such that the function synthesizing method further comprises the steps of comparing an output result of the output sentence with an output result obtained at a time point given by the generated logic circuit; and judging correctness of function synthesis based on the comparison result.

BRIEF DESCRIPTION OF THE DRAWINGS

This above-mentioned and other objects, features and advantages of this invention will become more apparent by reference to the following detailed description of the invention taken in conjunction with the accompanying drawings, wherein:

FIG. 3 is a flowchart showing an operation example of the function synthesizing section 2;

FIG. 4 shows an example of a C program;

FIG. 13 is a timing chart showing an example of an operation result of a logic circuit that is defined by the RT level data according to the embodiment;

FIGS. 14(a) and 14(b) show an example of a test bench program (a) for the C program and an example of its execution result (b), respectively;

DETAILED DESCRIPTION OF THE PREFERRED EMBODIMENTS

An embodiment of the present invention will be hereinafter described with reference to the accompanying drawings.

Figure 1:
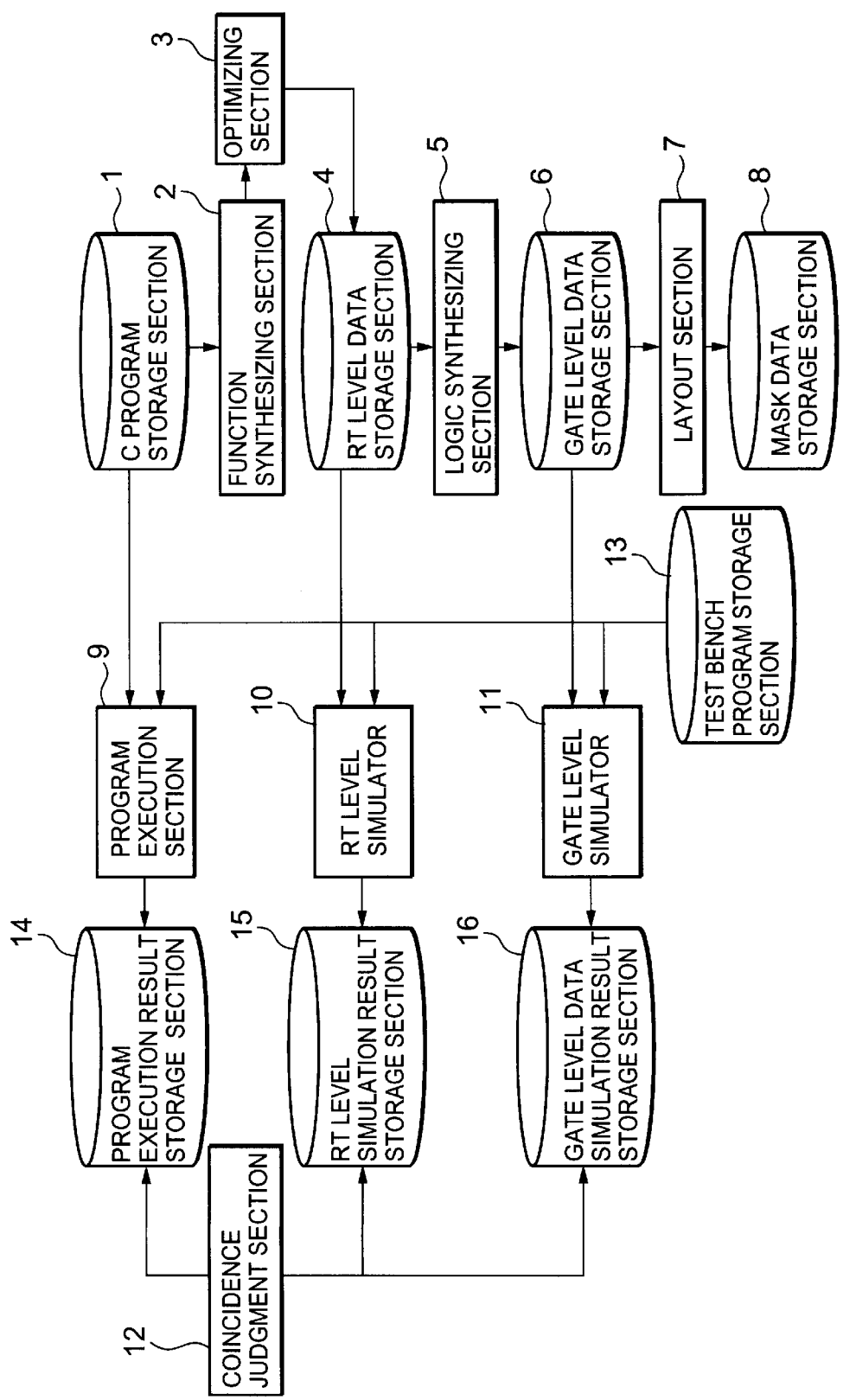
FIG. 1 is a block diagram showing a configuration example of an electronic circuit data (mask data) generation system to which a function synthesizing method according to an embodiment of the present invention is applied.

FIG. 1 is a block diagram showing a configuration example of an electronic circuit data (mask data) generation system to which a function synthesizing method according to the embodiment of the invention is applied.

Figure 21:
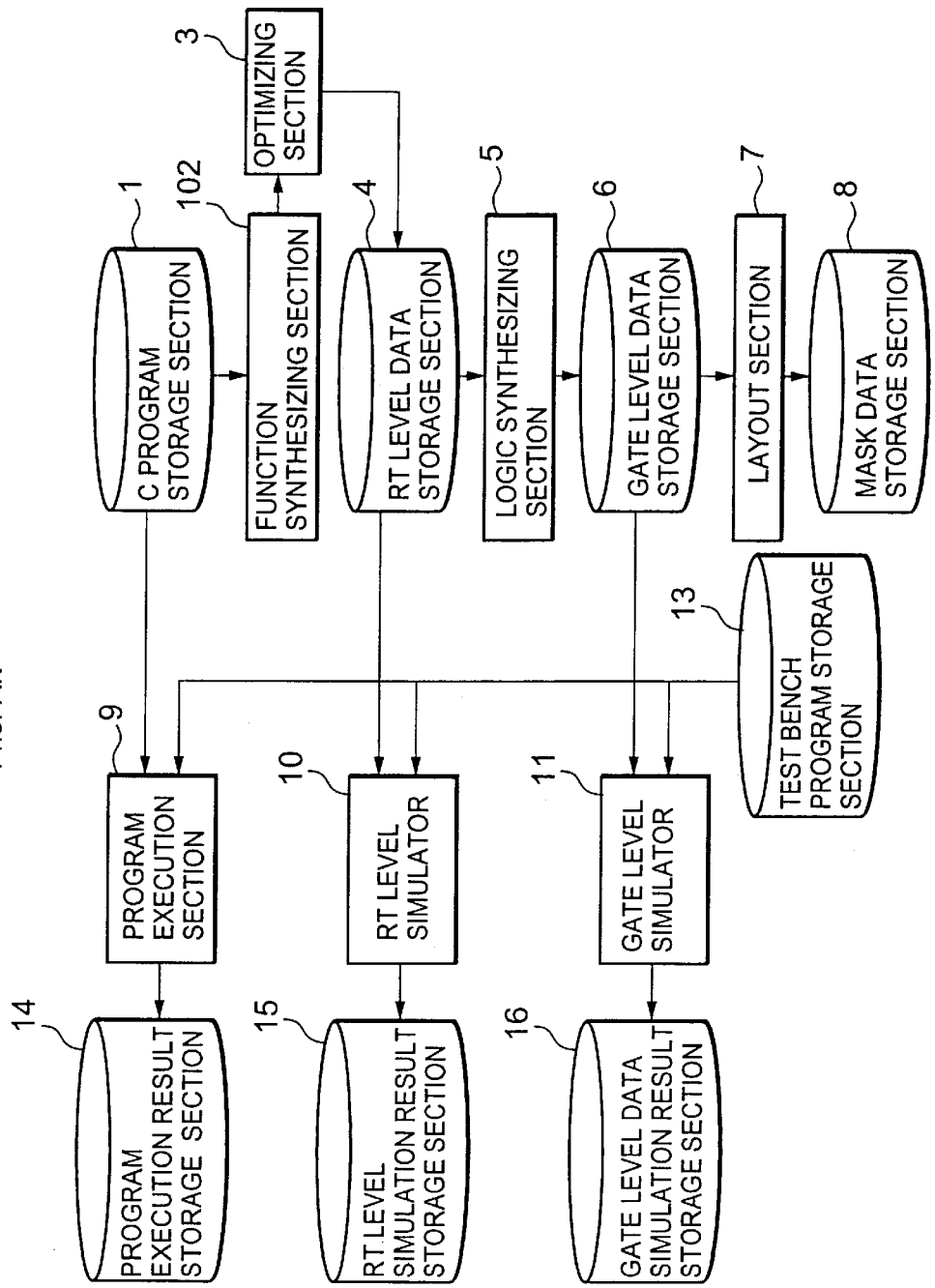
FIG. 21 is a block diagram showing a configuration example of an electronic circuit data (master data) generation system to which a conventional function synthesizing method is applied.
Figure 22:
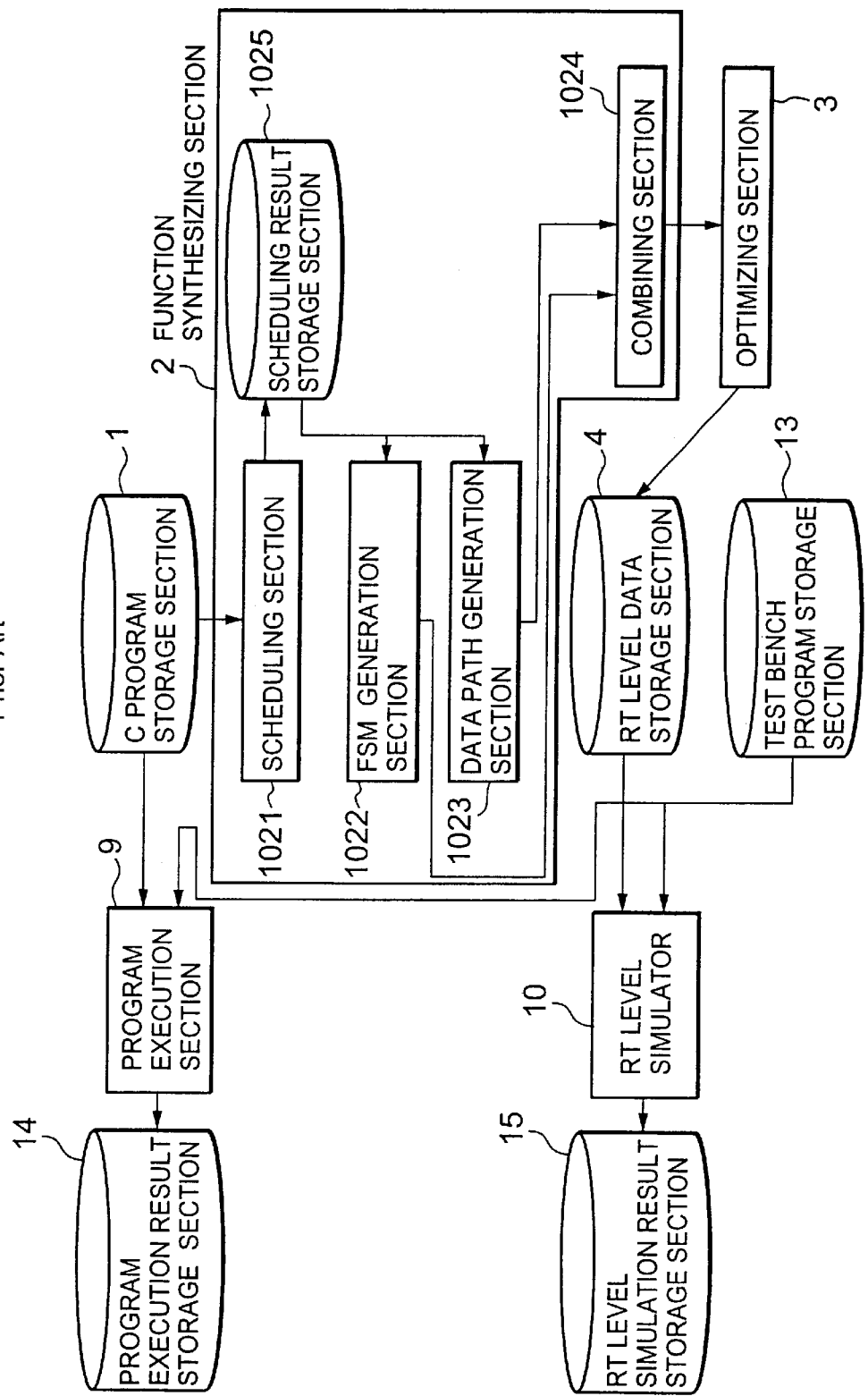
FIG. 22 is a block diagram showing a configuration example of a function synthesizing section 102.
Figure 23:
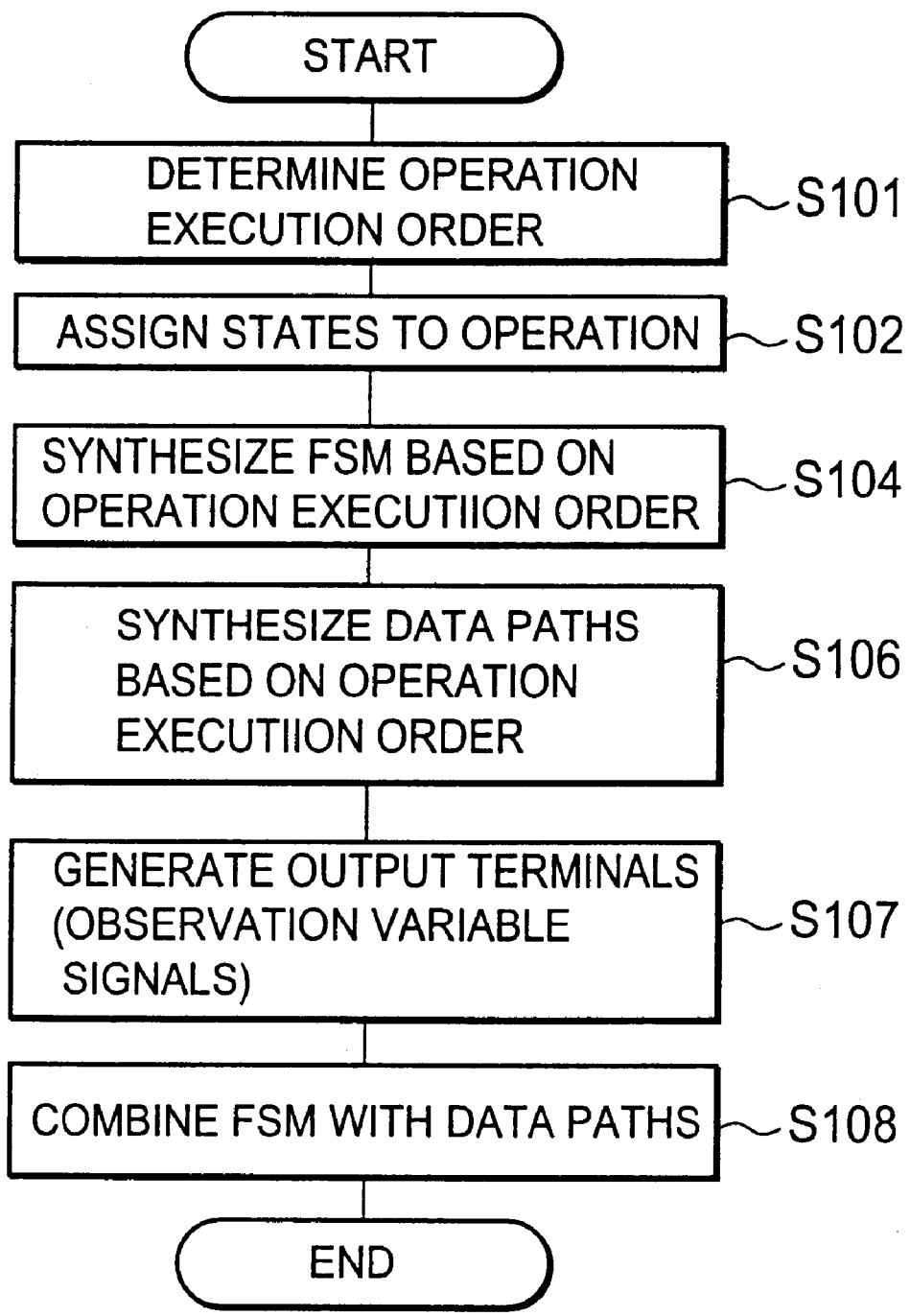
FIG. 23 is a flowchart showing an operation example of the function synthesizing section 102.
Figure 24:
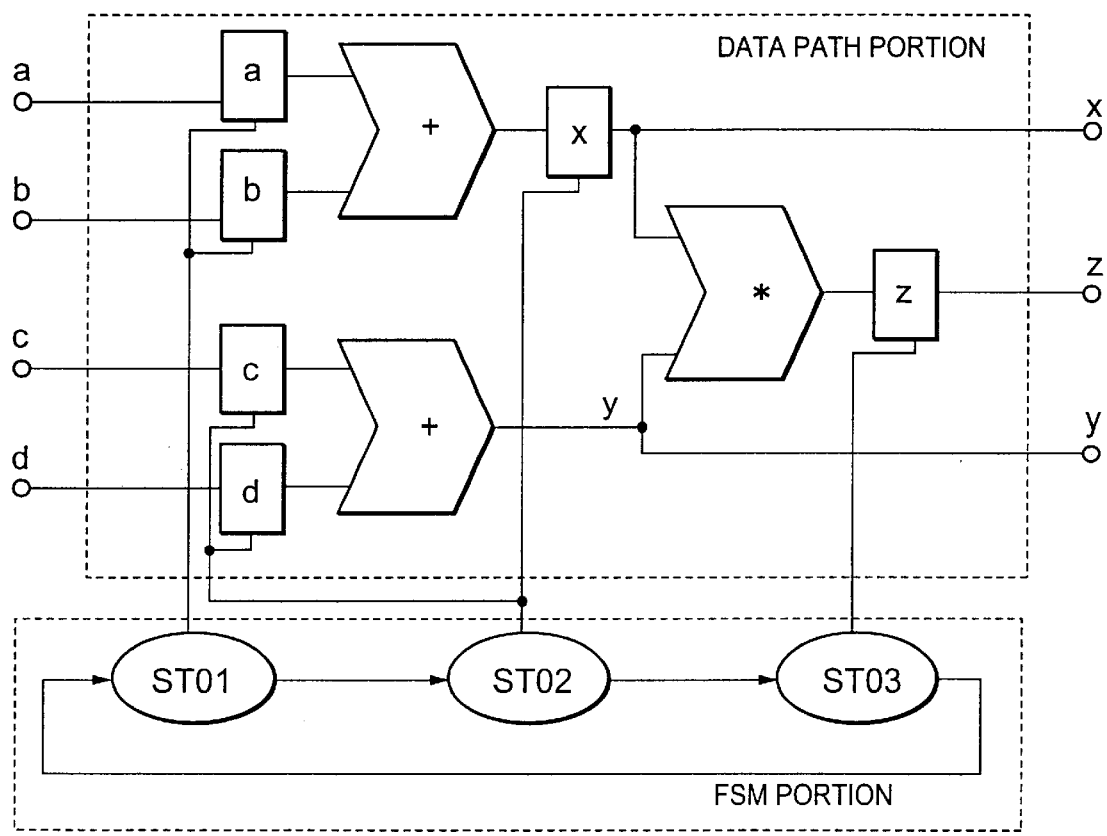
FIG. 24 shows an example of an RT level data generated by the conventional technology.
Figure 25:
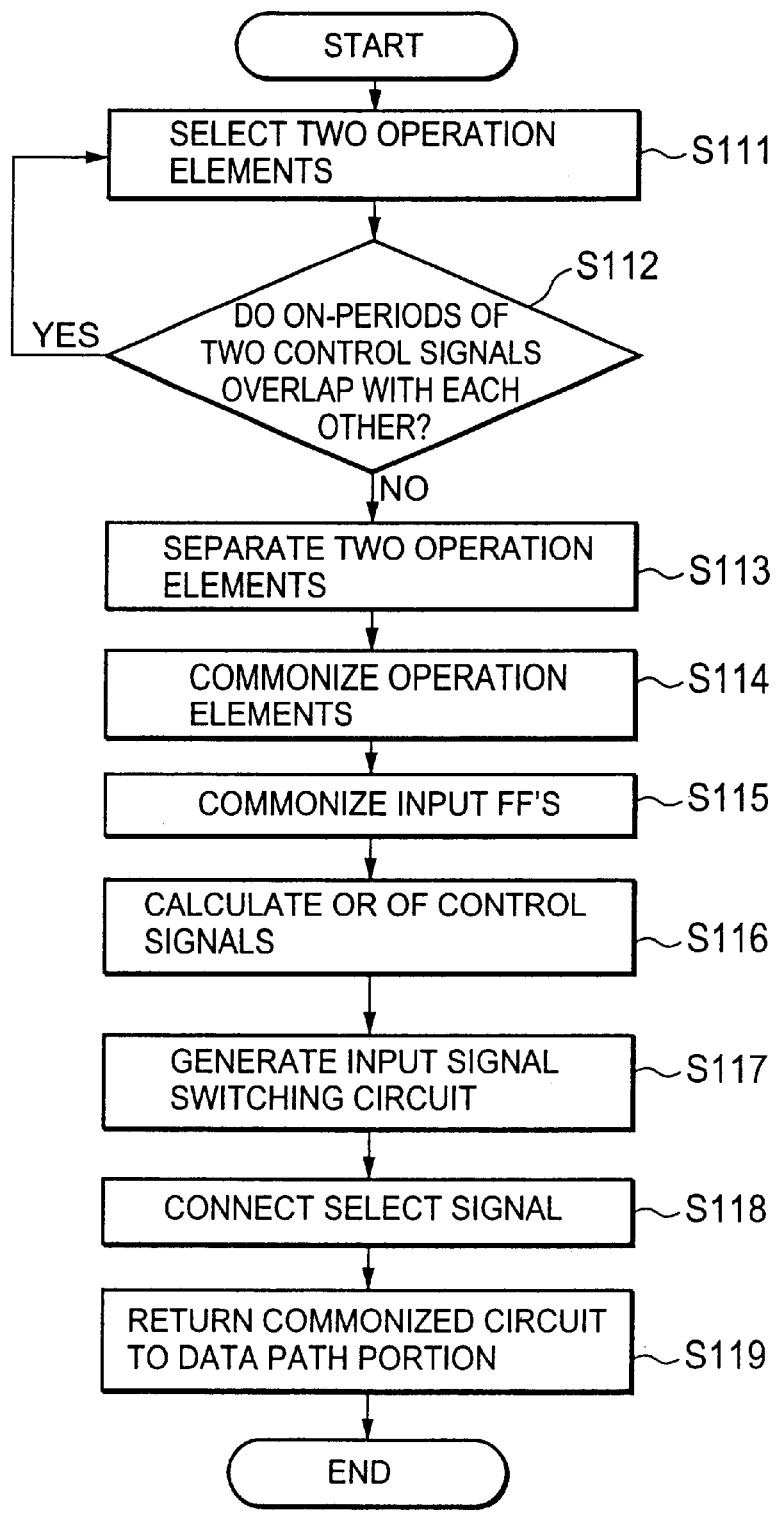
FIG. 25 is a flowchart showing an example of an optimization process.
Figure 26:
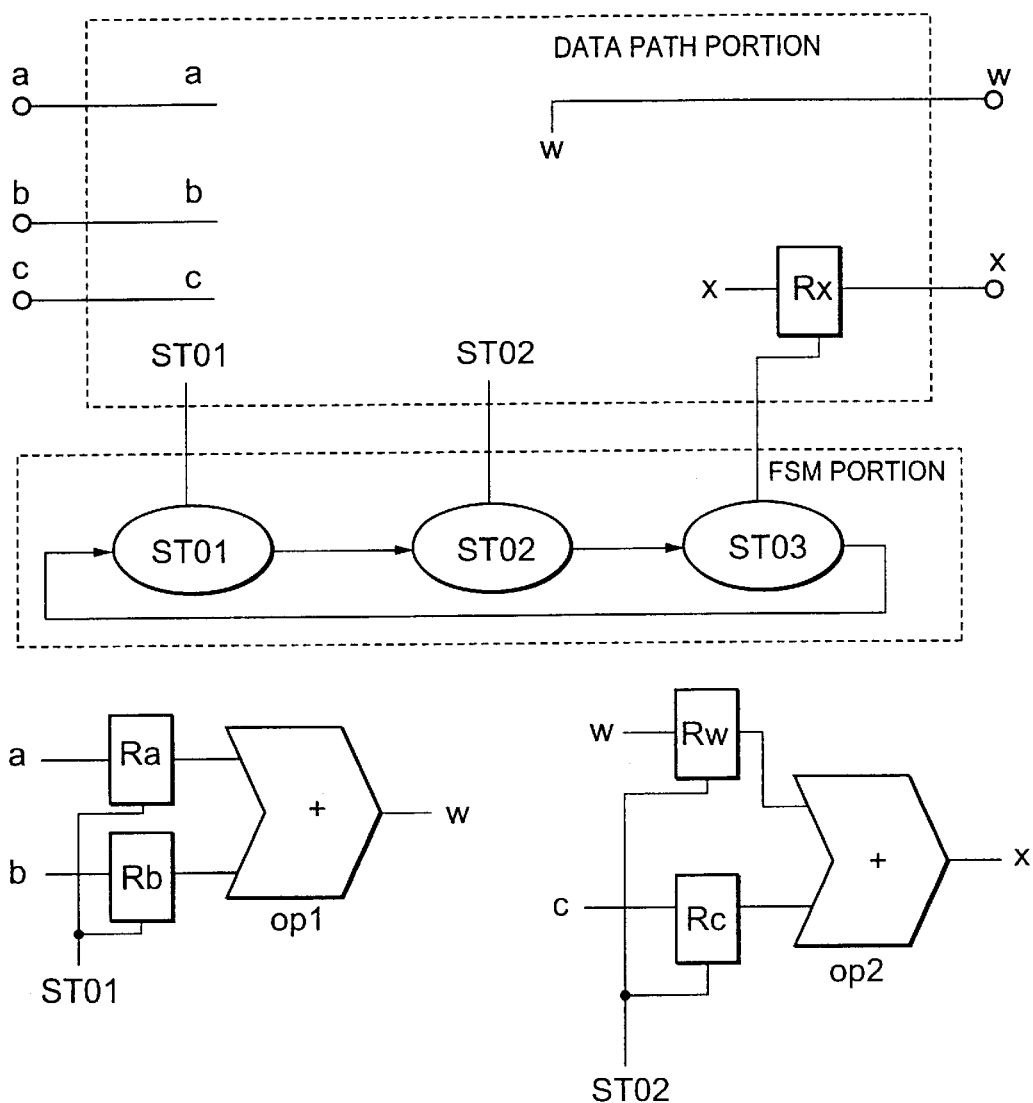
FIG. 26 shows an intermediate stage of the optimization process.
Figures 27, 28:
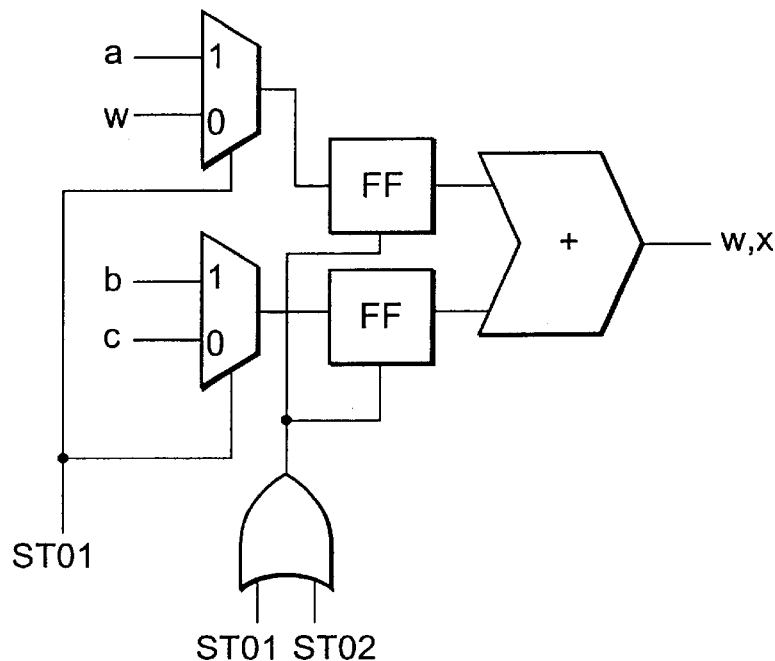
FIG. 27 shows an intermediate stage of the optimization process.
FIG. 28 is a table showing an example of an operation result of a logic circuit that is defined by the RT level data generated by the conventional technology.
Figure 29:
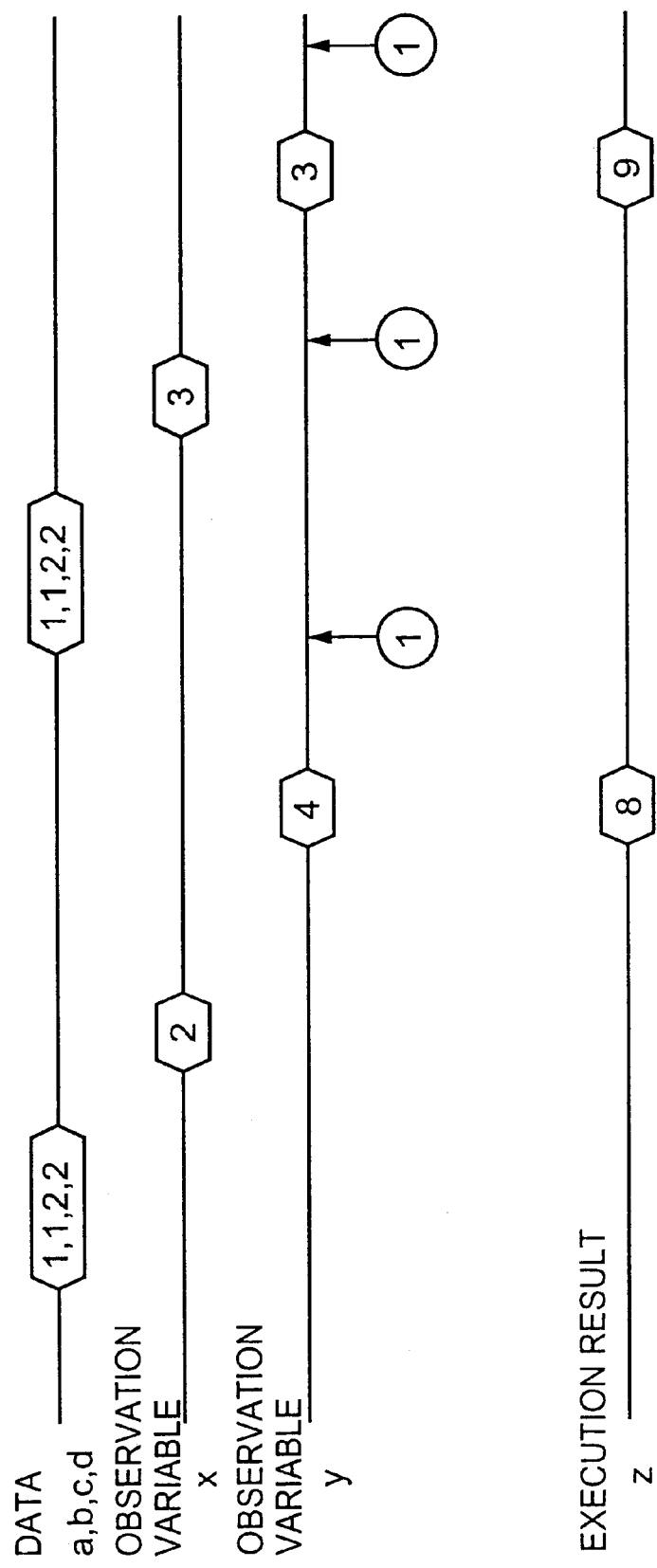
FIG. 29 is a timing diagram showing an example of the operation result of the logic circuit that is defined by the RT level data generated by the conventional technology.

The sections in FIG. 1 having corresponding sections in FIG. 21 are given the same reference numerals as the latter and descriptions therefor will be omitted.

The electronic circuit data generation system shown in FIG. 1 is characterized in that a function synthesizing section 2 is newly provided in place of the function synthesizing section 102 in FIG. 21.

Next, the configuration and operation of the function synthesizing section (i.e., the function synthesizing section 2 in FIG. 1) that executes the function synthesizing method according to the embodiment of the invention will be described.

Figure 2:
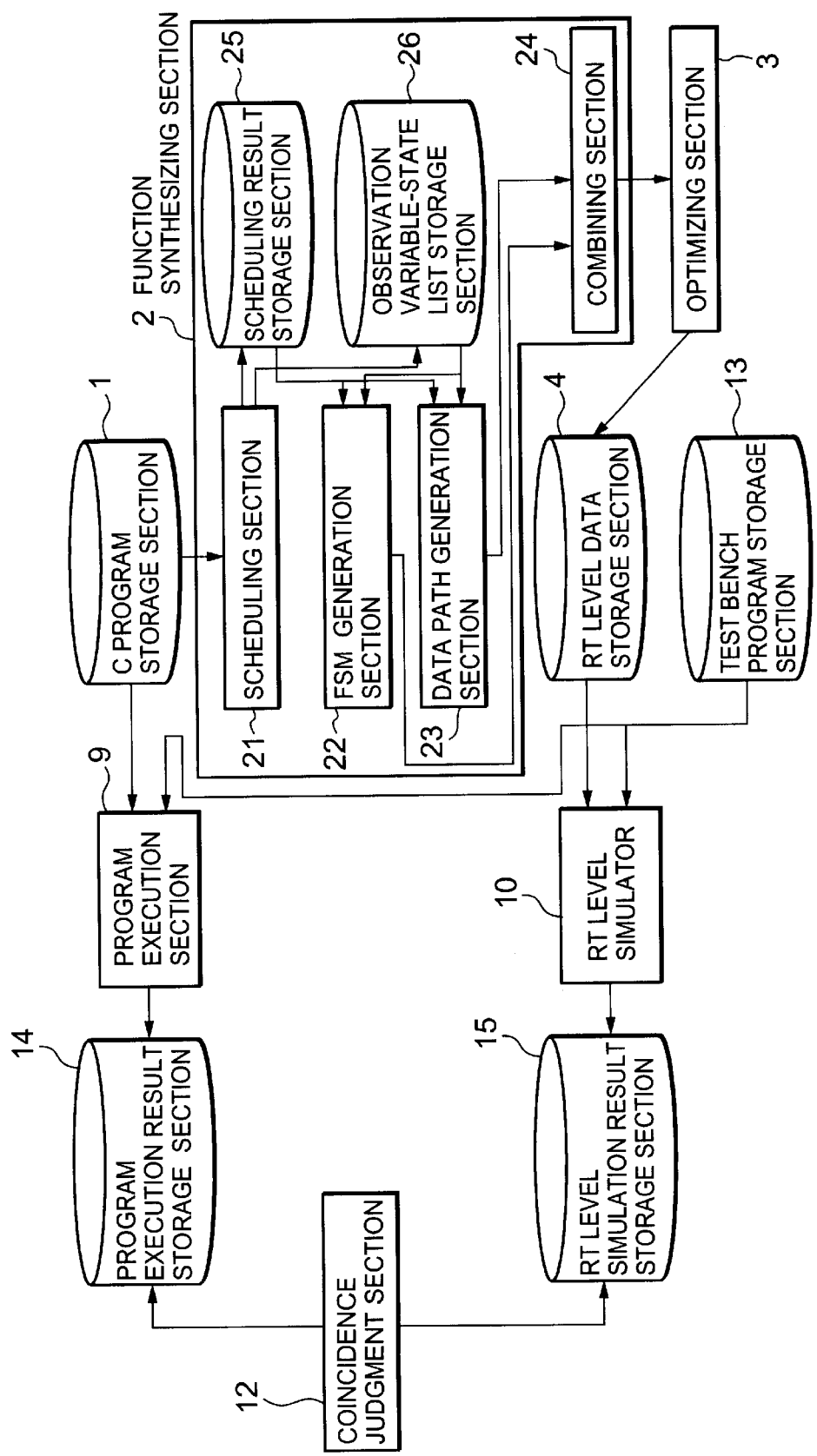
FIG. 2 is a block diagram showing a configuration example of a function synthesizing section 2.

FIG. 2 is a block diagram showing a configuration example of the function synthesizing section 2.

FIG. 3 is a flowchart showing an operation example of the function synthesizing section 2.

As shown in FIG. 2, the function synthesizing section 2 is configured by a scheduling section 21, an FSM generation section 22, a data path generation section 23, a combining section 24, a scheduling result storage section 25, and an observation variable-state list storage section 26.

With this configuration, when an operator gives the function synthesizing section 2 a function synthesis execution command by using a prescribed operation panel (not shown), the process of the function synthesizing section 2 goes to step S1 in FIG. 3.

In step S1, the scheduling section 21 reads out a C program from the C program storage section 1.

As an example (hereinafter, referred to as the example), assume here that a C program shown in FIG. 4 is read out.

Then, the scheduling section 21 disregards output sentences in the read-out C program and generates a data flow graph based on only operation sentences.

Figure 5:
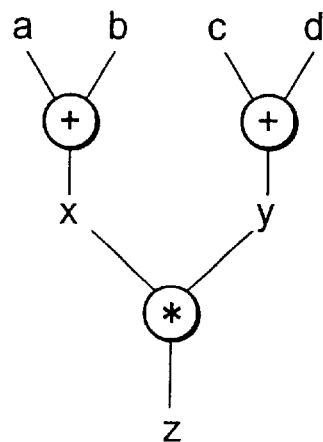
FIG. 5 shows an example of a data flow graph.

In this embodiment, the scheduling section 21 generates a data flow graph shown in FIG. 5 based on the C program shown in FIG. 4.

Then, the process of the function synthesizing section 2 goes to step S2 in FIG. 3.

In step S2, the scheduling section 21 divides, by using a prescribed operation clock signal, the data flow graph into operations that are performed at respective clock cycles of the operation clock signal.

Figure 6:
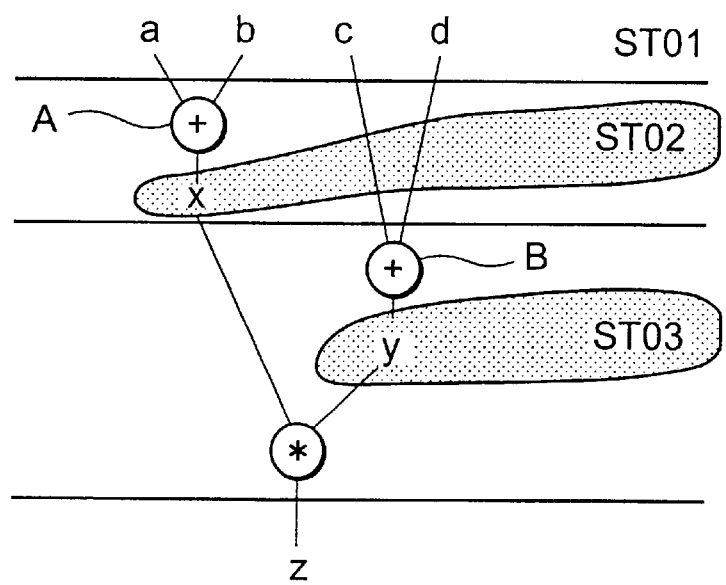
FIG. 6 shows an example of a divided data flow graph.

In this embodiment, the scheduling section 21 divides the data flow graph of FIG. 5 in a manner shown in FIG. 6.

As in the case of the conventional technology, the divisional pattern (i.e., the number of operations to be performed at respective clock cycles) depends on various parameters (relating to electronic circuit designing) that are preset by an operator.

That is, if the parameters are so set as to generate a high-speed electronic circuit, the data flow graph is divided so that as many operations as possible are performed per clock.

On the other hand, if the parameters are so set as to reduce the electronic circuit scale, the data flow graph is divided so that each gate can be reused by as many operations as possible (i.e., operations of the same kind are performed at as many different clocks as possible).

Then, the scheduling section 21 assigns state names (identification names unique to respective clocks) to respective clocks.

In this example, state names ST01, ST02, and ST03 are assigned as shown in FIG. 6.

The scheduling section 21 stores a state-assigned data flow graph in the scheduling result storage section 25.

Then, the process of the function synthesizing section 2 goes to step S3 in FIG. 3.

In step S3, the scheduling section 21 detects observation variables from the C program.

In this embodiment, the C program includes the following output sentences:

printf("x=%d¥n", x);

and printf("y=%d¥n", y);

Therefore, the scheduling section 21 detects x and y as observation variables.

Then, the scheduling section 21 detects operations that output values of the observation variables from the state-assigned data flow graph by detecting the observation variables from the state-assigned data flow graph.

In this example, the scheduling section 21 detects operation A that outputs a value of observation variable x and operation B that outputs a value of observation variable y from the data flow graph shown in FIG. 6.

Then, the scheduling section 21 generates an observation variable-state list that consists of the names of states where the above-detected operations (i.e., the operations that output values of the observation variables) and the observation variables, and stores the observation variable-state list in the observation variable-state list storage section 26.

Figures 7, 8:
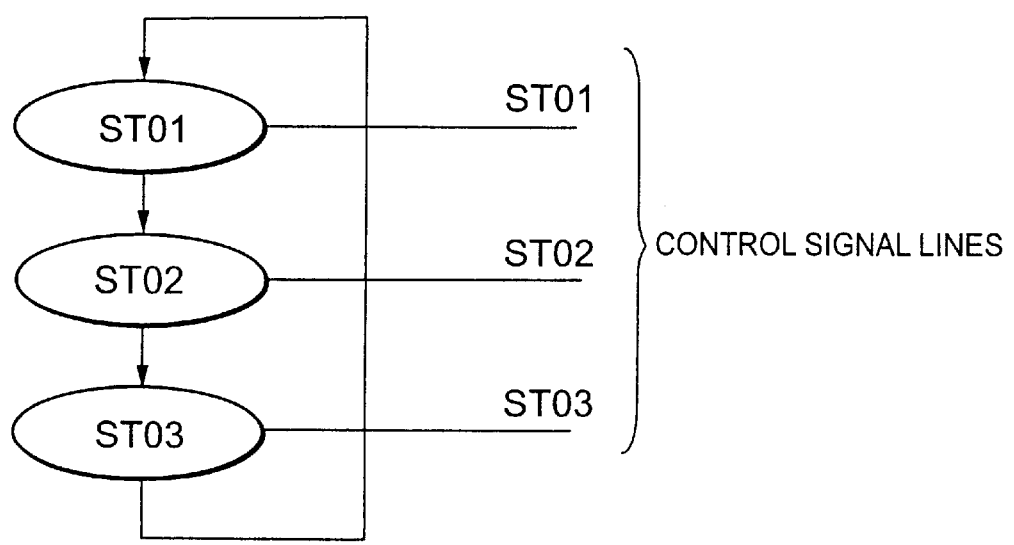
FIG. 7 is a table showing an example of an observation variable-state list.
FIG. 8 shows an example of an FSM.

In this example, since operation A that outputs a value of variable x is executed in state ST02 and operation B that output a value of observation variable y is executed in state ST03, the scheduling section 21 generates an observation variable-state list shown in FIG. 7.

Then, the process of the function synthesizing section 2 goes to step S4 in FIG. 3.

In step S4, the FSM generation section 22 generates an FSM based on the scheduling result (i.e., the state-assigned data flow graph) stored in the scheduling result storage section 25.

In this example, the FSM generation section 22 generates an FSM shown in FIG. 8 based on the data flow graph shown in FIG. 6.

Then, the process of the function synthesizing section 2 goes to step S5 in FIG. 3.

In step S5, the FSM generation section 22 detects, from the FSM, control signal lines corresponding to the respective states that are stored in the observation variable-state list, and adds output terminals (of an RT level description) to the detected control signal lines.

Figure 9:
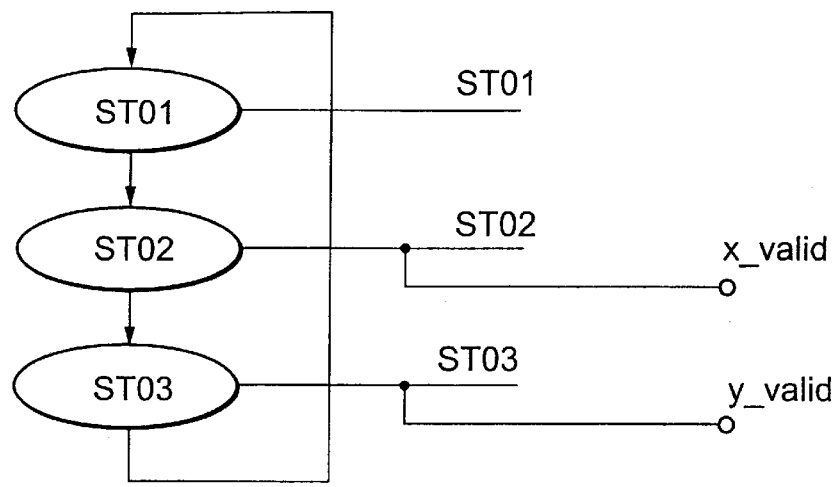
FIG. 9 shows an example of the FSM to which output terminals are added.

In this example, since states ST02 and ST03 are stored in the observation variable-state list as shown in FIG. 7, the FSM generation section 22 extends control signal lines corresponding to states ST02 and ST03 and adds output terminals x_valid and y_valid (of an RT level description) as shown in FIG. 9.

Then, the process of the function synthesizing section 2 goes to step S6 in FIG. 3.

In step S6, the data path generation section 23 generates data paths based on the scheduling result (i.e., the state-assigned data flow graph) that is stored in the scheduling result storage section 25.

Further, the data path generation section 23 detects variables that should hold a value over a plurality of states based on the state-assigned data flow graph, and adds flip-flops to signal lines (in the data paths) corresponding to the detected variables.

A trigger signal (control signal) to be applied to each flip-flop is made a signal corresponding to a state that is one-step before a state where the operation is executed by using a value of the variable corresponding to the flip-flop.

Figure 10:
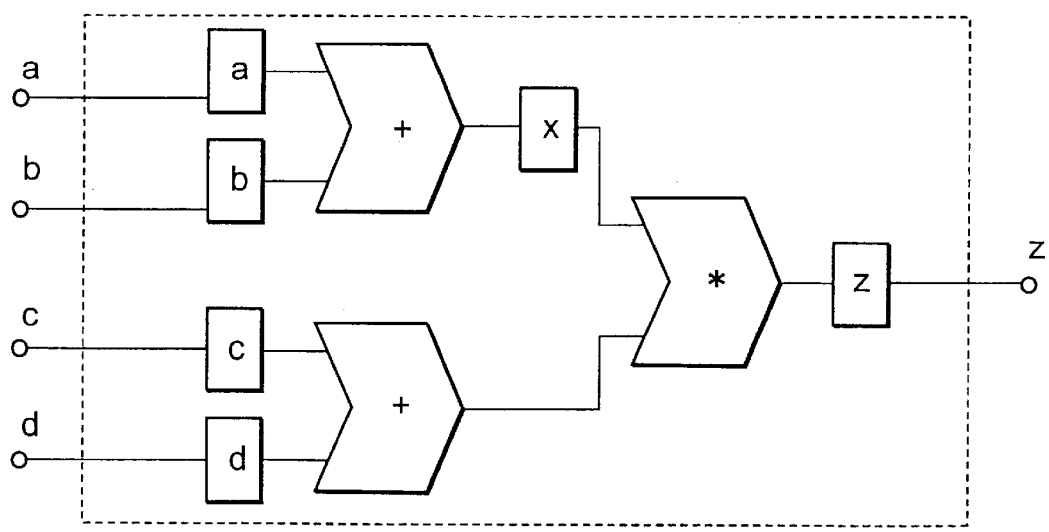
FIG. 10 shows an example of data paths.

In this example, the data path generation section 23 generates data paths shown in FIG. 10 based on the data flow graph shown in FIG. 6.

Since values of variables a and b are used in addition in state ST02 as shown in FIG. 6, in FIG. 10 a control signal corresponding to state ST01 is given to the flip-flops corresponding to variables a and b.

Since values of variables c and d are used in addition in state ST03, a control signal corresponding to state ST02 is given to the flip-flops corresponding to variables c and Since a value of x is used in multiplication in state ST03, a control signal corresponding to state ST02 is given to the flip-flop corresponding to variable x.

Since it is not necessary to hold a value of y over a plurality of states, no flip-flop corresponding to variable y is added.

It appears that a value of z is merely output and is not used in any operation. However, since variable z is connected to another circuit at an output destination (and hence used in operation), variable z is used in an external circuit in state ST01 (attention should be paid to the fact that state ST01 follows state ST03 as shown in FIG. 8). Therefore, a control signal corresponding to state ST03 is given to the flip-flop corresponding to variable z.

Then, the process of the function synthesizing section 2 goes to step S7 in FIG. 3.

In step S7, the data path generation section 23 detects signal lines corresponding to the observation variables from the data paths, and adds output terminals (of an RT level description) to the detected signal lines.

Figure 11:
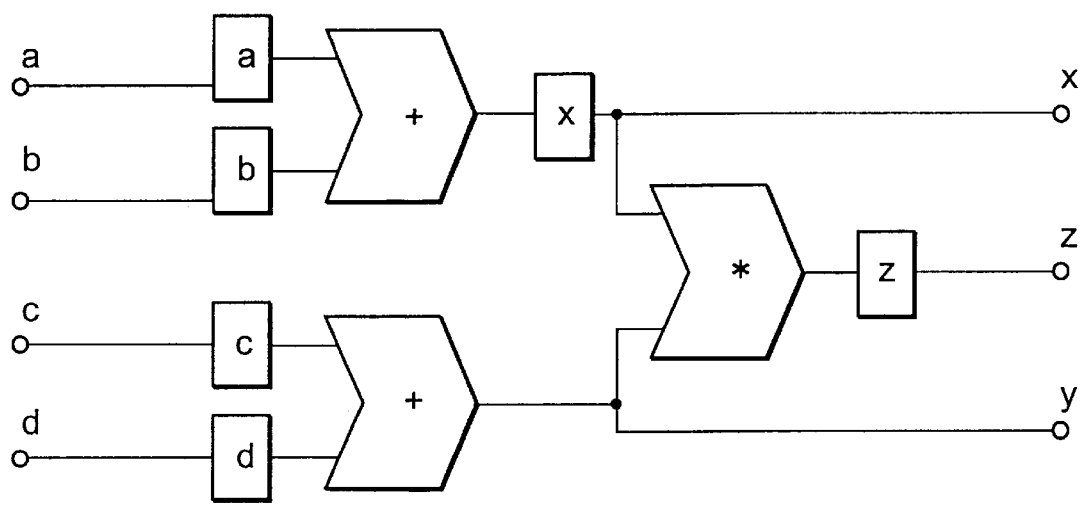
FIG. 11 shows an example of the data paths to which output terminals are added.

In this embodiment, since the observation variables are x and y, the data path generation section 23 adds output terminals (of an RT level description) to the signal lines corresponding to observation variables x and y as shown in FIG. 11.

Then, the process of the function synthesizing section 2 goes to step S8 in FIG. 3.

In step S8, the combining section 24 combines the FSM (generated by the FSM generation section 22) with the data paths (generated by the data path generation section 23) and thereby generates RT level data.

Specifically, the combining section 24 connects the control signal line (in the FSM) corresponding to each state to the clock terminal(s) of the flip-flop(s) (in the data paths) corresponding to the state.

Figure 12:
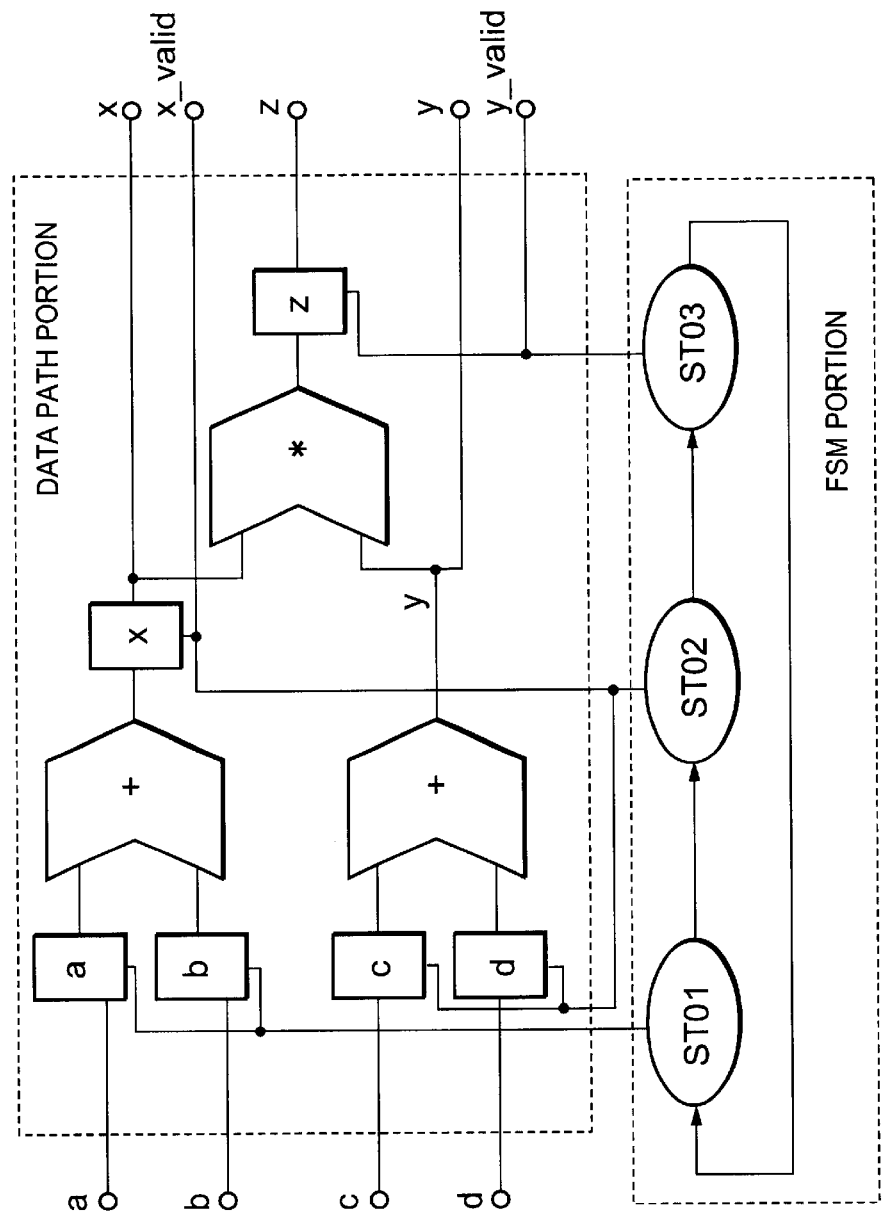
FIG. 12 shows an example of RT level data according to the embodiment.

In this embodiment, the combining section 24 combines the FSM shown in FIG. 9 with the data paths shown in FIG. 11 and thereby generates RT level data shown in FIG. 12.

The description of the configuration and operation of the function synthesizing section 2 has completed.

Incidentally, in this embodiment, as in the case of the conventional example, each data (RT level data or Gate level data) that is generated at an intermediate stage is subjected to an operation check.

A program execution section 9, an RT level simulator 10, a Gate level simulator 11, a coincidence judgment section 12, a test bench program storage section 13, a program execution result storage section 14, an RT level simulation result storage section 15, and a Gate level simulation result storage section 16 shown in FIG. 1 are sections for such an operation check.

FIG. 13 is a timing chart showing an operation example result of a logic circuit that is defined by RT level data generated by the function synthesizing method according to the embodiment. FIG. 13 shows a result of an operation that is performed when a test bench program (for RT level data) that gives the same test data as a test bench program (for a C program) shown in FIG. 14(a) is used.

In FIG. 13, signals indicated by "states ST01, ST02, and ST03" are pulses that are applied to (the clock terminals of) the flip-flops shown in FIG. 12.

In FIG. 13, values that are given as data a, b, c, and d, that is, "1, 1, 2, 2" and "1, 2, 1, 2," are values (test data) that are read into the logic circuit via the input terminals a, b, c, and d shown in FIG. 12 (with the timing shown in FIG. 13). They have the same values as the test data (arguments of a function calc) that are given by the test bench program (for a C program) shown in FIG. 14(a).

In FIG. 13, values read out as observation variable x, that is, "2" and "3," are values read out from the output terminal x shown in FIG. 12 (with the timing shown in FIG. 13) and have the same values as values of a C program execution result ("x=2" and "x=3") shown in FIG. 14(b) (in this case, the values of x are intermediate values). These values are obtained with the timing shown in FIG. 13 ("1+1" and "1+2").

In FIG. 13, values read out as observation variable y, that is, "4" and "3," are values read out from the output terminal y shown in FIG. 12 (with the timing shown in FIG. 13) and have the same values as values of a C program execution result ("y=4" and "x=3") shown in FIG. 14(b) (in this case, the values of y are intermediate values). These values are obtained with the timing shown in FIG. 13 ("2+2" and "1+2").

In FIG. 13, validation signal x_valid is pulses that are output from the output terminal x_valid shown in FIG. 12, and indicates readout time points of data x.

Validation variable y_valid shown in FIG. 13, is pulses that are output from the output terminal y_valid shown in FIG. 12, and indicates readout time points of data y.

In FIG. 13, values read out as execution result z (in this case, final values), that is, "8" and "9," are values read out from the output terminal z shown in FIG. 12 (with the timing shown in FIG. 13) and have the same values as values of a C program execution result ("result=8" and "result=9") shown in FIG. 14(b). These values are obtained with the timing shown in FIG. 13 ("2*4" and "3*3").

In this example, the coincidence judgment section 12 reads out data from the output terminal x (shown in FIG. 12) at the time points indicated by the pulses x_valid, and reads out data from the output terminal y (shown in FIG. 12) at the time points indicated by the pulses y_valid.

The coincidence judgment section 12 compares the above values and data that are read out from the output terminal z with the values of the execution result (of the C program) shown in FIG. 14(b).

Since they coincide with each other in the example of FIGS. 13 and 14(a)–14(b), the coincidence judgement section 12 judges that the function synthesis by the function synthesizing section 2 has been performed normally.

As described above, in the embodiment, output terminals (of an RT level description) are added not only to signal lines (of an RT level description) corresponding to observation variables but also to control signal lines corresponding to states where operations that output values of the observation variables. Therefore, readout time points of the observation variables can easily be obtained from the latter output terminals.

Therefore, an execution result of a C program and an operation result of a logic circuit that is defined by RT level data obtained by synthesizing a function corresponding to the C program can easily be compared with each other.

The embodiment of the invention has been described above in detail with reference to the drawings. Specific configurations are not limited to those of the embodiment and the invention encompasses design modifications etc. that do not depart from the spirit and scope of the invention.

For example, although in the embodiment (and the conventional technology), the function synthesizing section and the optimizing section 3 are separated from each other, the relationship between these two sections are not limited to such a case and, for example, the optimizing section 3 may be included in the function synthesizing section.

Even where the logic synthesizing section 5 is included in the function synthesizing section, comparison between a C program execution result and a simulation result of Gate level data can similarly be made easier.

Figure 30:
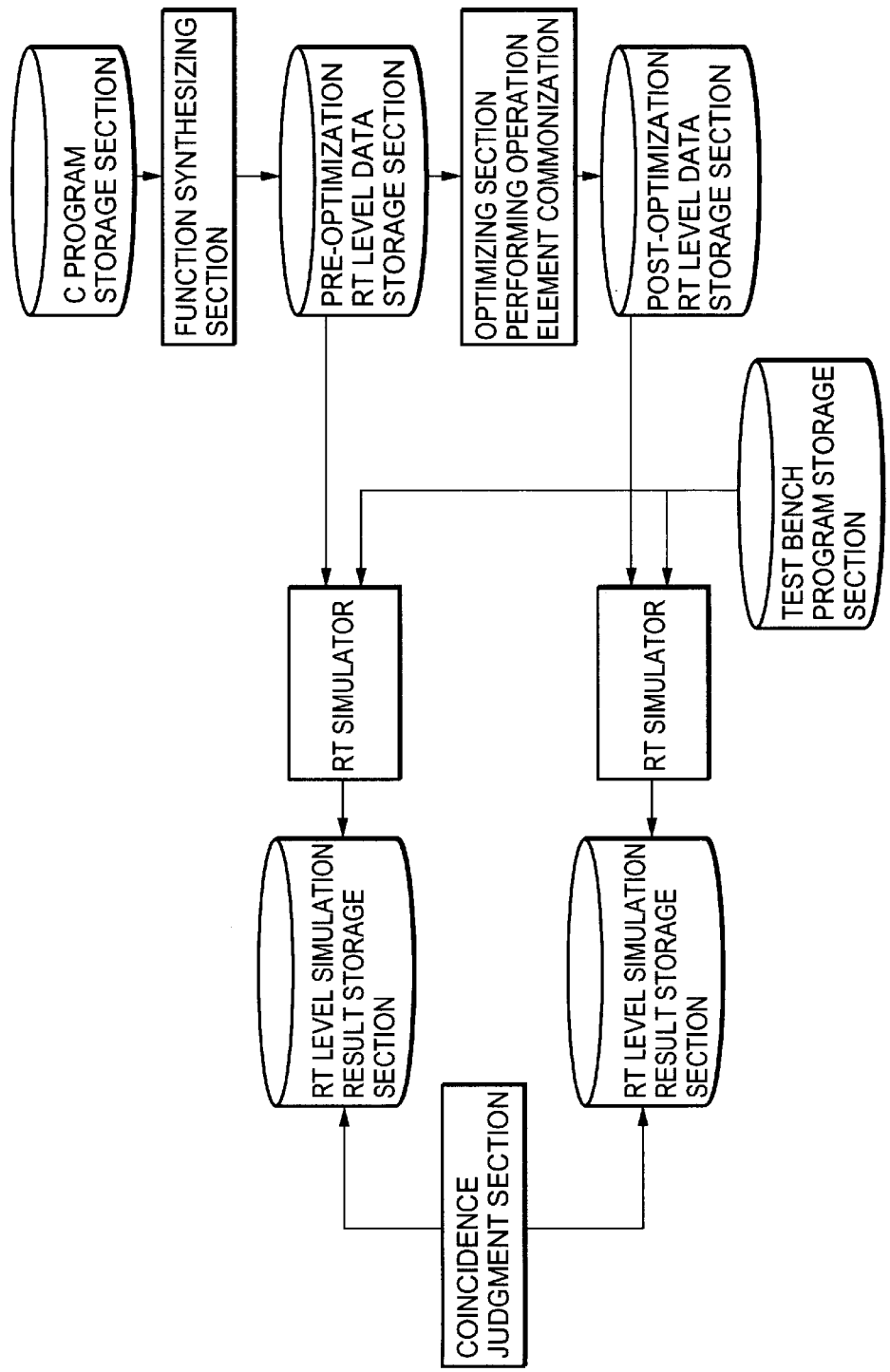
FIG. 30 is a block diagram showing a configuration example for comparing the RT level data before and after optimization.

FIG. 30 is a block diagram showing a congifuration for comparing RT level data before and after optimization. In this embodiment, RT level data (i.e., RT level data before optimization) generated by the function synthesizing section 2 and RT level data optimized by the optimizing section 3 are subjected to simulations by the RT level simulator 10 (that uses the same test bench program) and simulation results are compared with each other by the coincidence judgment section 12. In this manner, the correctness of the optimization by the optimizing section 3 can be judged.

For example, consideration using the conventional function synthesizing method will be given to a case of optimizing RT level data shown in FIG. 15 into RT level data shown in FIG. 16.

Figure 15:
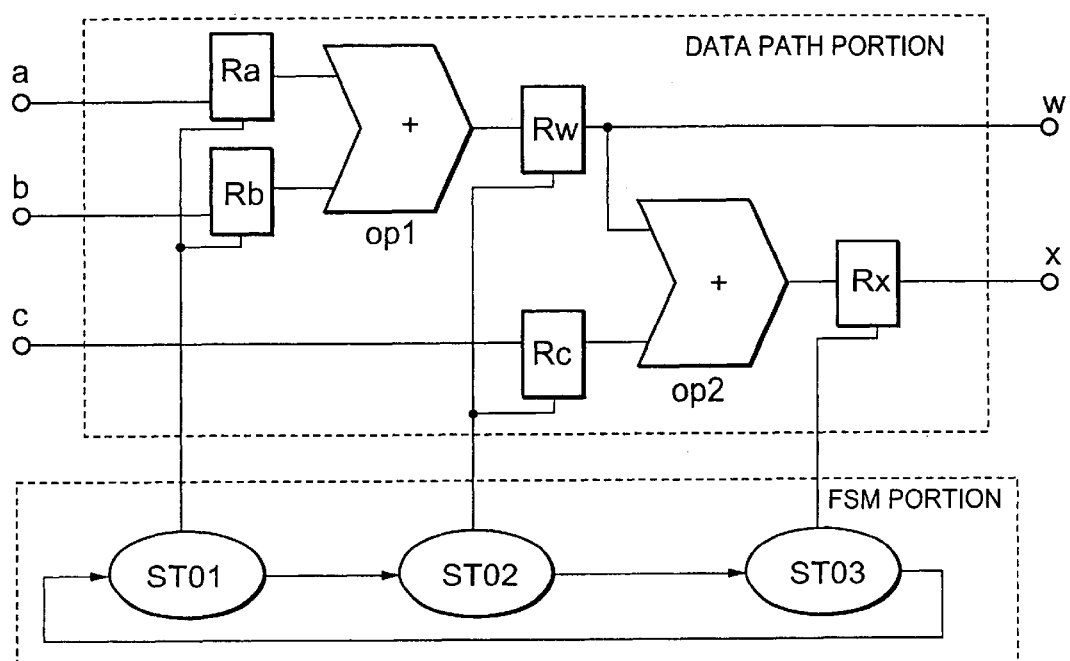
FIG. 15 shows an example of the RT level data before optimization.

Specifically, consideration will be given to a case where comparison between an x value in a simulation result of RT level data before optimization (shown in FIG. 15) and an x value in a simulation result of RT level data after the optimization (shown in FIG. 16) finds non-coincidence and a w value shown in FIG. 15 is compared with a w' value shown in FIG. 16 to check whether an error has already occurred at the time of calculation of a+b.

Figure 16:
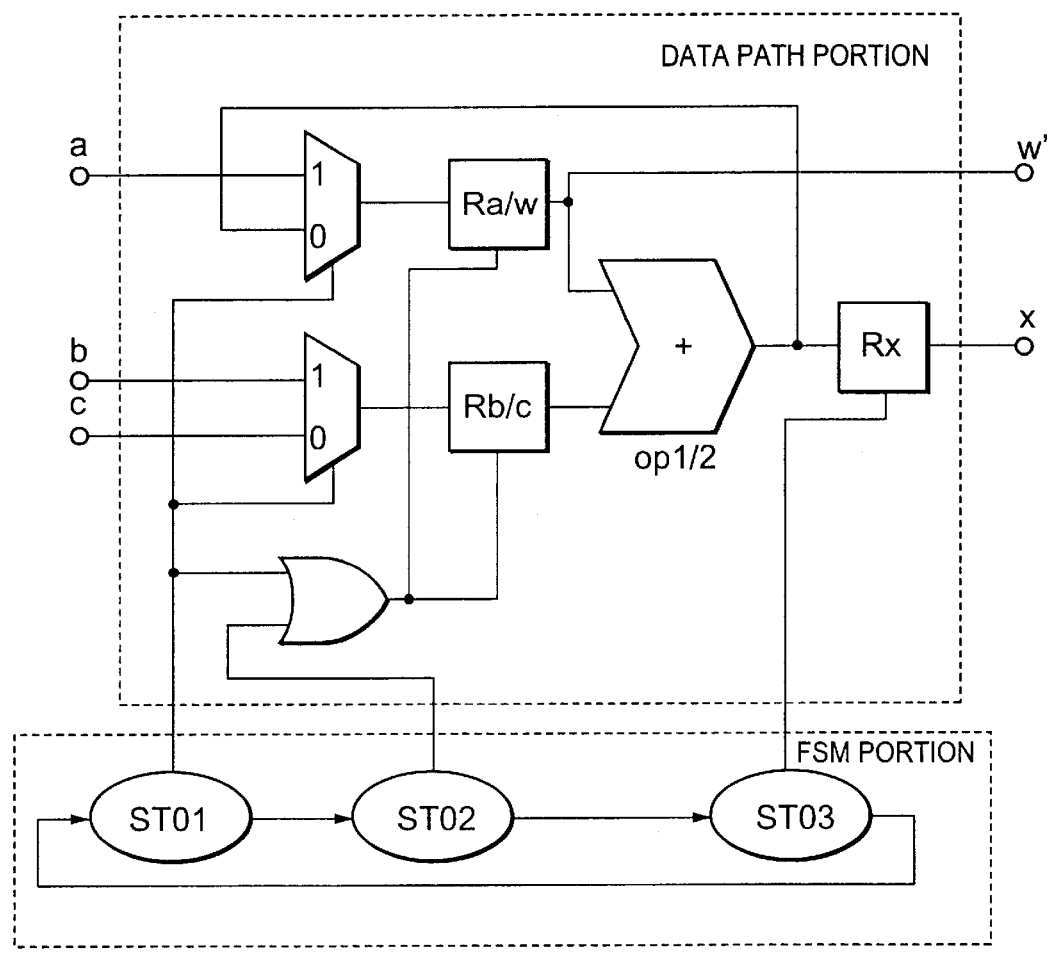
FIG. 16 shows an example of the RT level data after the optimization.
Figure 17:
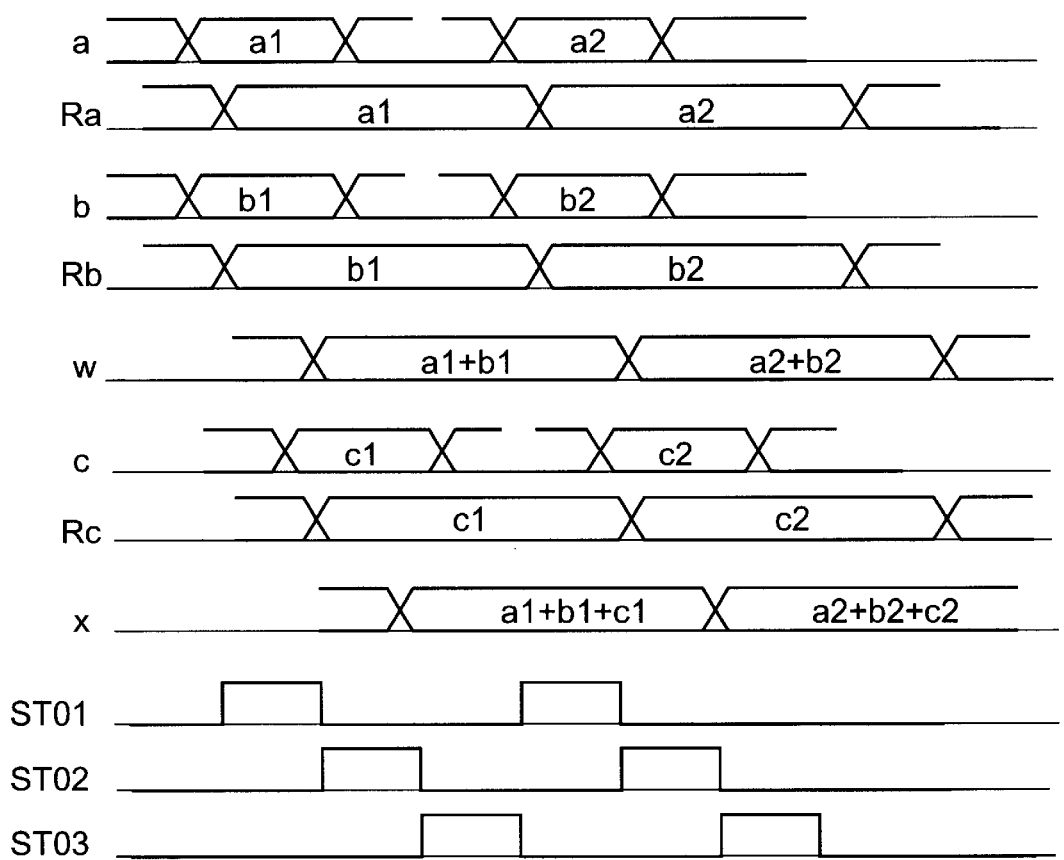
FIG. 17 is a timing chart showing an example of a simulation result before optimization.
Figure 18:
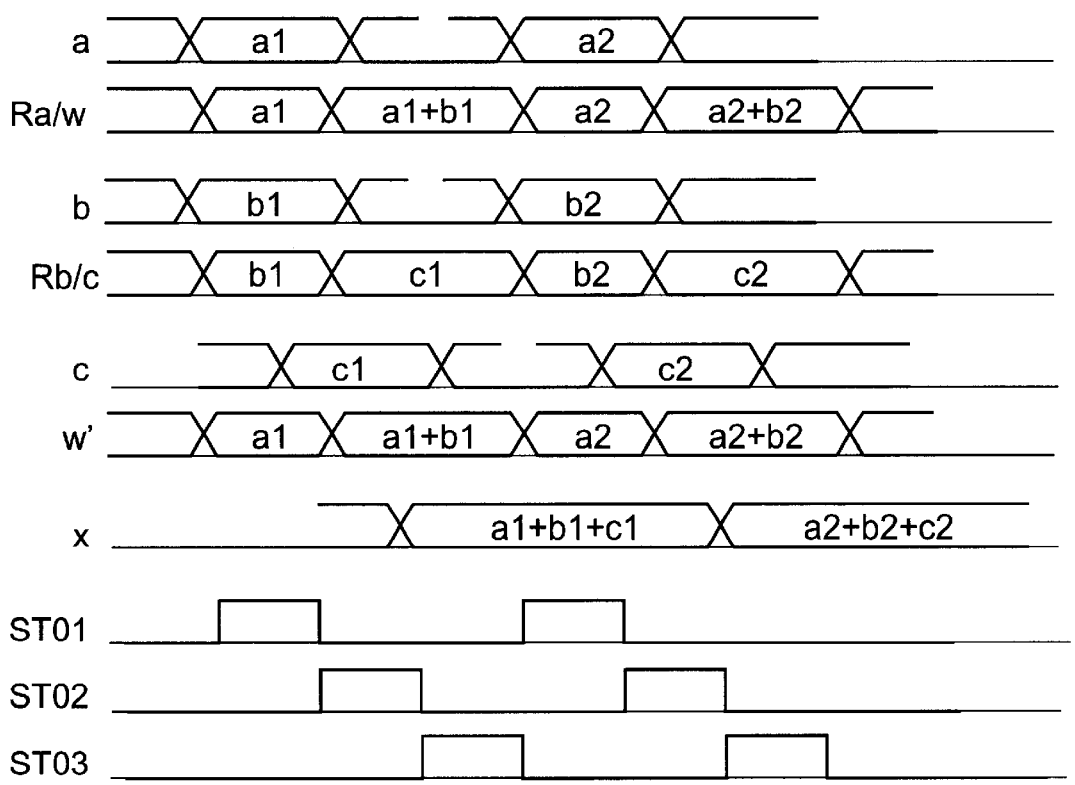
FIG. 18 is a timing chart showing an example of a simulation result after the optimization.

FIG. 17 shows a simulation result of RT level data before optimization (shown in FIG. 15), and FIG. 18 shows a simulation result of RT level data after the optimization (shown in FIG. 16).

In comparing a value of w in FIG. 17 with a value of w' in FIG. 18, the conventional technique has a problem that it cannot be determined when to compare w in a simulation result before optimization (FIG. 17) with w' in a simulation result after the optimization (FIG. 18) because input values coming from the input terminal a and operation result values of the operator op1/2 appear alternately at the output terminal w' of the RT level data after the optimization (FIG. 16).

Figure 19:
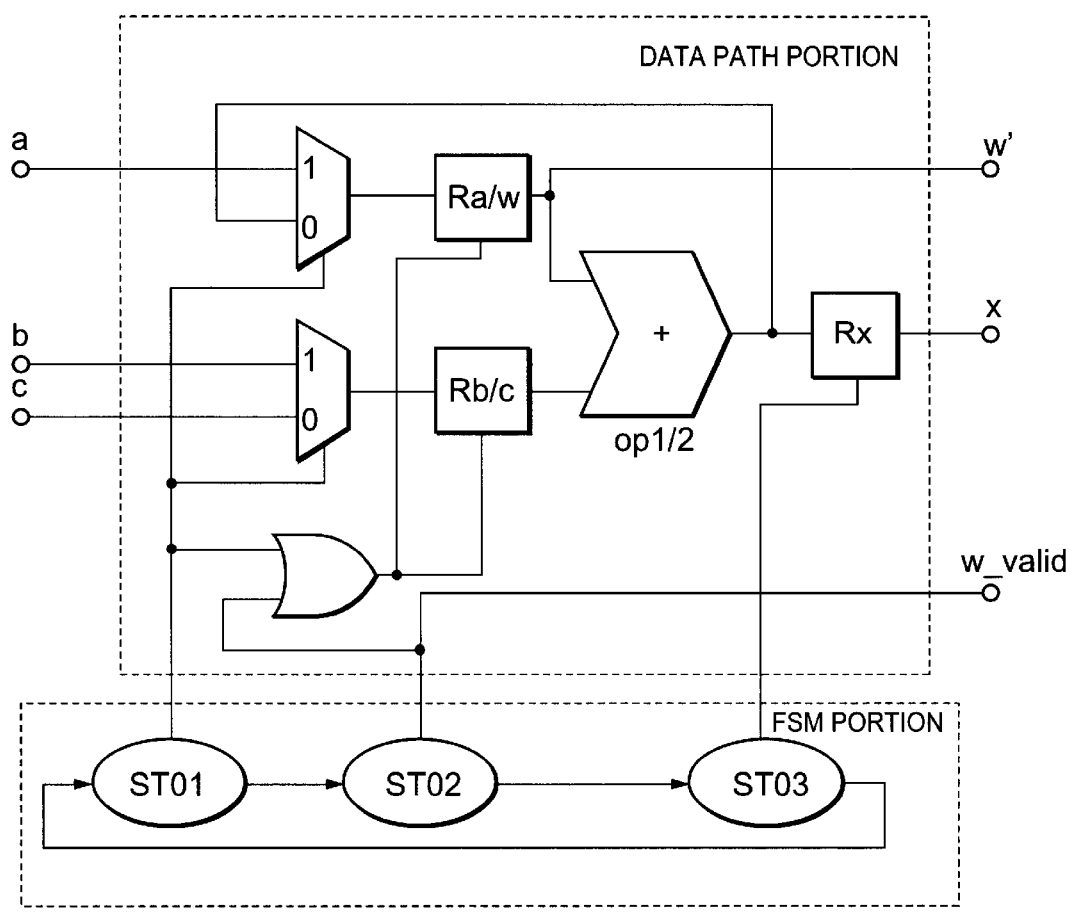
FIG. 19 shows an example of post-optimization RT level data according to the embodiment.

In contrast, RT level data shown in FIG. 19 is obtained when the function synthesizing method according to the embodiment is employed.

In the RT level data according to the embodiment (FIG. 19), an output terminal w_valid is added to the RT level data according to the conventional technique (FIG. 16).

Although the output terminal w_valid is added (by the function synthesizing section 2) before the optimization that is performed by the optimizing section 3, an output signal from this terminal can be used as a timing signal of w' (even after the optimization by the optimizing section 3).

Figure 20:
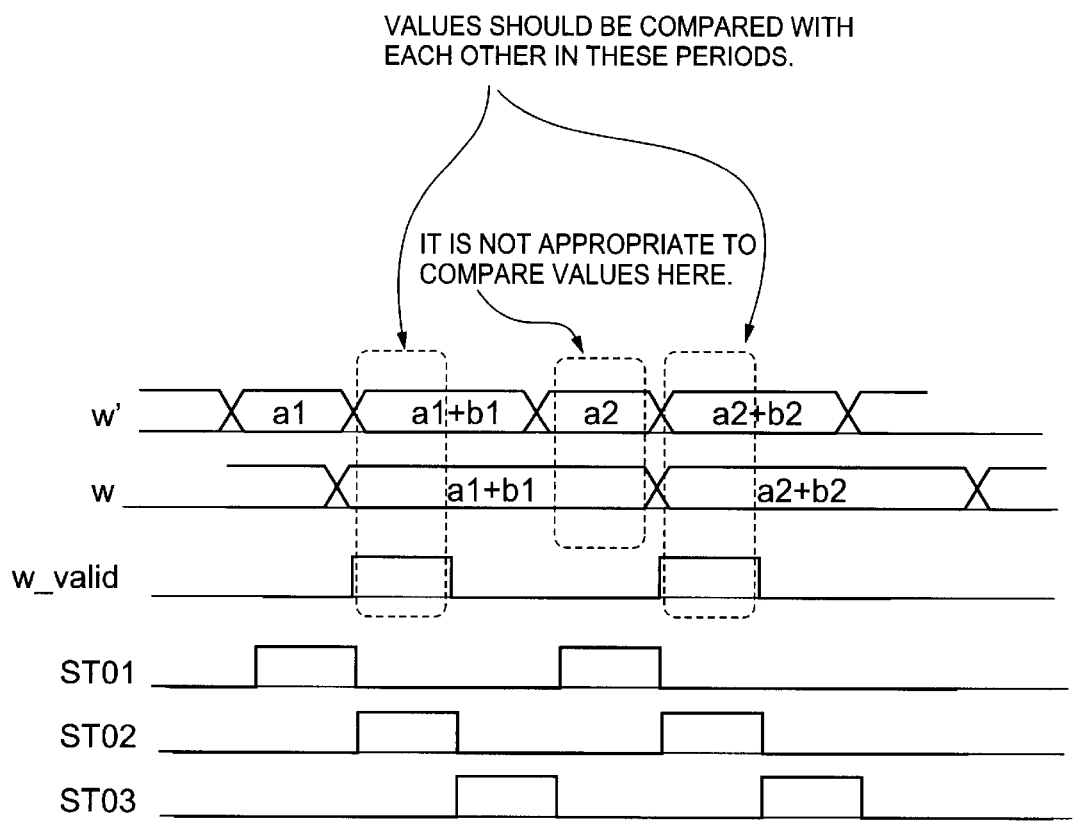
FIG. 20 is a timing chart showing an example of a post-optimization simulation result according to the embodiment.

FIG. 20 shows a simulation result of the RT level data according to the embodiment (FIG. 19), which will be used to describe an advantage of the invention.

As shown in FIG. 20, in the RT level data according to the embodiment, since a time point when an operation result of the adder op1/2 is determined is obtained from an output signal of the output terminal w_valid, whether a w value and a w' value before and after the optimization, respectively, coincide with each other (i.e., correctness of the optimization) can be judged by comparing a w' value that is obtained at a time point when the output signal of the output terminal w_valid is turned On with a w value in the simulation result before the optimization (FIG. 17). In the conventional method, it cannot be determined at which point in the output signal of w_valid comparison should be made (see FIG. 20). For example, an error occurs if comparison is made in a period indicated by the central broken-line rectangle in FIG. 20 where the output signal of w_valid is Off.

As described above, the invention provides an advantage that a program execution result and an operation result of a logic circuit can easily be compared with each other in a timely manner. This makes it possible to check at an intermediate stage whether function synthesis is being performed normally. Therefore, alterations can be made quickly even when an abnormality occurs. Further, outputs of internal terminals (i.e., intermediate operation results) before and after optimization can easily be compared with each other.

What is claimed is:

1. A function synthesizing method for generating a logic circuit from a program, comprising the steps of:

dividing the program;

assigning state names to respective divisional ranges;

detecting a state name of a state where an operation that outputs a value of an observation variable that is designated by an output command in the program is executed;

generating, based on the program, a finite state machine that controls state transitions between states having the state names;

extending, to an output, a signal indicating a transition timing of the detected state name as a timing signal for reading out a value of the observation variable;

generating data paths based on the program; and generating a logic circuit by combining the finite state machine with the data paths.

2. The function synthesizing method according to claim 1, further comprising the step of generating, by modifying the generated logic circuit, a second logic circuit being equivalent in function to and smaller in circuit scale than the generated logic circuit.

3. The function synthesizing method according to claim 1, further comprising the steps of:

comparing an output result of an output command in the program with an output result of the generated logic circuit synchronized with the signal indicating the transition timing of the detected state name; and judging correctness of function synthesis based on result of the comparing.

4. A synthesizing apparatus for generating a logic circuit from a program, comprising:
  means for dividing the program;
  means for assigning state names to respective divisional ranges;
  means for detecting a state name of a state where an operation that outputs a value of an observation variable that is designated by an output command in the program is executed;
  means for generating, based on the program, a finite state machine that controls state transitions between states having the state names;
  means for extending, to an output, a signal indicating a transition timing of the detected state name as a timing signal for reading out a value of the observation variable;
  means for generating data paths based on the program; and
  means for generating a logic circuit by combining the finite state machine with the data paths.

5. The function synthesizing apparatus according to claim 4, further comprising means for generating, by modifying the generated logic circuit, a second logic circuit being equivalent in function to and smaller in circuit scale than the generated logic circuit.

6. A recording medium on which a program for causing a computer to execute a function synthesizing method for generating a logic circuit from a program is recorded, the function synthesizing method comprising the steps of:
  dividing the program;
  assigning state names to respective divisional range;
  detecting a state name of a state where an operation that outputs a value of an observation variable that is designated by an output command in the program is executed;
  generating, based on the program, a finite state machine that controls state transitions between states having the state names;
  extending, to an output, a signal indicating a transition timing of the detected state name as a timing signal for reading out a value of the observation variable;
  generating data paths based on the program; and
  generating a logic circuit by combining the finite state machine with the data paths.

7. The recording medium according to claim 6, wherein the function synthesizing method further comprising the steps of:
  comparing an output result of the output command in the program with an output result of generated logic circuit synchronized with the signal indicating the transition timing of the detected state name; and
  judging correctness of function synthesis based on result of the comparing.

8. A function synthesizing method for generating a logic circuit from a program, comprising the steps of:
  generating a first logic circuit performing an operation defined by the program, and
  appending a second logic circuit to the first logic circuit, the second logic circuit providing a timing signal for comparing comprising behavior of the first logic circuit with behavior of execution of the program;
  wherein the second logic circuit is generated based on an observation variable which is designated by an output command in the program, and the second logic circuit comprises an output terminal and wiring for indicating a transition timing of the first logic circuit.

9. The function synthesizing method of claim 8, wherein the program is written in a general-purpose programming language, and the program is converted into the first logic circuit.

10. The function synthesizing method of claim 9, wherein the general-purpose programming language is the C language.

11. The function synthesizing method of claim 8, wherein the first logic circuit and the second logic circuit are register transfer level circuits.

* * * * *

UNITED STATES PATENT AND TRADEMARK OFFICE
CERTIFICATE OF CORRECTION

PATENT NO. : 6,711,728 B1
DATED : March 23, 2004
INVENTOR(S) : Otsobu

It is certified that error appears in the above-identified patent and that said Letters Patent is hereby corrected as shown below:

Title page,
Item [56], References Cited, U.S. PATENT DOCUMENTS, please include the following:

-- 5,740,070      04/14/1998      Nishimoto et al. --
FOREIGN PATENT DOCUMENTS, please include the following:

-- 5250437      06/11/1992      JAPAN
   6098157      09/18/1992      JAPAN --

Signed and Sealed this

Thirty-first Day of August, 2004

JON W. DUDAS
*Director of the United States Patent and Trademark Office*